US009911801B2

(12) United States Patent
Yamazaki et al.

(10) Patent No.: US 9,911,801 B2
(45) Date of Patent: *Mar. 6, 2018

(54) LIGHT EMITTING DEVICE

(71) Applicant: Semiconductor Energy Laboratory Co., Ltd., Atsugi-shi, Kanagawa-ken (JP)

(72) Inventors: Shunpei Yamazaki, Tokyo (JP); Jun Koyama, Kanagawa (JP); Tatsuya Arao, Kanagawa (JP); Munehiro Azami, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/614,663

(22) Filed: Jun. 6, 2017

(65) Prior Publication Data
US 2017/0271426 A1  Sep. 21, 2017

Related U.S. Application Data

(63) Continuation of application No. 15/134,468, filed on Apr. 21, 2016, now Pat. No. 9,679,955, which is a
(Continued)

(30) Foreign Application Priority Data

Jan. 17, 2001 (JP) .................. 2001-008379

(51) Int. Cl.
*H01L 27/32* (2006.01)
*H01L 27/12* (2006.01)
*H01L 29/786* (2006.01)

(52) U.S. Cl.
CPC ........ *H01L 27/3265* (2013.01); *H01L 27/124* (2013.01); *H01L 27/1255* (2013.01);
(Continued)

(58) Field of Classification Search
CPC .................................................. H01L 27/3265
See application file for complete search history.

(56) References Cited

U.S. PATENT DOCUMENTS 5,182,620 A  1/1993  Shimada et al.
5,712,495 A  1/1998  Suzawa
(Continued)

FOREIGN PATENT DOCUMENTS

EP  1031873 A  8/2000
JP  63-121886 A  5/1988
(Continued)

OTHER PUBLICATIONS

Baldo.M et al., "Highly Efficient Phosphorescent Emission From Organic Electroluminescent Devices", Nature, Sep. 10, 1998, vol. 395, pp. 151-154.
(Continued)

*Primary Examiner* — Lex Malsawma
(74) *Attorney, Agent, or Firm* — Fish & Richardson P.C.

(57) ABSTRACT

A light emitting device is provided which can prevent a change in gate voltage due to leakage or other causes and at the same time can prevent the aperture ratio from lowering. A capacitor storage is formed from a connection wiring line, an insulating film, and a capacitance wiring line. The connection wiring line is formed over a gate electrode and an active layer of a TFT of a pixel, and is connected to the active layer. The insulating film is formed on the connection wiring line. The capacitance wiring line is formed on the insulating film. This structure enables the capacitor storage to overlap the TFT, thereby increasing the capacity of the
(Continued)

capacitor storage while keeping the aperture ratio from lowering. Accordingly, a change in gate voltage due to leakage or other causes can be avoided to prevent a change in luminance of an OLED and flickering of screen in analog driving.

15 Claims, 21 Drawing Sheets

Related U.S. Application Data continuation of application No. 14/920,972, filed on Oct. 23, 2015, now Pat. No. 9,324,775, which is a continuation of application No. 14/614,502, filed on Feb. 5, 2015, now Pat. No. 9,171,896, which is a continuation of application No. 14/322,990, filed on Jul. 3, 2014, now Pat. No. 8,952,385, which is a continuation of application No. 14/037,437, filed on Sep. 26, 2013, now Pat. No. 8,779,431, which is a continuation of application No. 13/555,292, filed on Jul. 23, 2012, now Pat. No. 8,546,825, which is a continuation of application No. 13/241,351, filed on Sep. 23, 2011, now Pat. No. 8,237,179, which is a continuation of application No. 12/879,032, filed on Sep. 10, 2010, now Pat. No. 8,039,853, which is a continuation of application No. 11/773,172, filed on Jul. 3, 2007, now Pat. No. 7,808,002, which is a continuation of application No. 10/986,931, filed on Nov. 15, 2004, now Pat. No. 7,242,024, which is a continuation of application No. 10/050,597, filed on Jan. 15, 2002, now Pat. No. 6,825,496.

(52) U.S. Cl.
CPC ...... *H01L 27/3246* (2013.01); *H01L 27/3258* (2013.01); *H01L 27/3262* (2013.01); *H01L 27/3276* (2013.01); *H01L 29/78633* (2013.01)

(56) References Cited

U.S. PATENT DOCUMENTS

| | | | |
|---|---|---|---|
| 5,747,830 A * | 5/1998 | Okita | G02F 1/136209 249/110 |
| 5,747,930 A | 5/1998 | Utsugi | |
| 5,815,226 A | 9/1998 | Yamazaki et al. | |
| 5,856,689 A | 1/1999 | Suzawa | |
| 5,955,209 A | 9/1999 | Murata et al. | |
| 5,998,841 A | 12/1999 | Suzawa | |
| 6,057,647 A | 5/2000 | Kurosawa et al. | |
| 6,118,506 A | 9/2000 | Yamazaki et al. | |
| 6,121,652 A | 9/2000 | Suzawa | |
| 6,137,551 A | 10/2000 | Jeong | |
| 6,229,506 B1 | 5/2001 | Dawson et al. | |
| 6,278,131 B1 * | 8/2001 | Yamazaki | H01L 27/1237 257/347 |
| 6,323,918 B1 * | 11/2001 | Yoshioka | G02F 1/136209 349/111 |
| 6,351,078 B1 | 2/2002 | Wang et al. | |
| 6,358,766 B1 | 3/2002 | Kasahara | |
| 6,372,534 B1 | 4/2002 | Den Boer et al. | |
| 6,384,808 B2 | 5/2002 | Azami | |
| 6,414,345 B1 | 7/2002 | Suzawa | |
| 6,441,829 B1 | 8/2002 | Blalock et al. | |
| 6,462,722 B1 | 10/2002 | Kimura et al. | |
| 6,476,419 B1 | 11/2002 | Yasuda | |
| 6,490,014 B1 | 12/2002 | Ohtani et al. | |
| 6,492,778 B1 | 12/2002 | Segawa | |
| 6,495,886 B1 | 12/2002 | Yamazaki et al. | |
| 6,506,636 B2 | 1/2003 | Yamazaki et al. | |
| 6,509,616 B2 | 1/2003 | Yamazaki | |
| 6,521,913 B1 | 2/2003 | Murade | |
| 6,522,315 B2 | 2/2003 | Ozawa et al. | |
| 6,573,195 B1 | 6/2003 | Yamazaki et al. | |
| 6,576,926 B1 | 6/2003 | Yamazaki et al. | |
| 6,593,592 B1 | 7/2003 | Yamazaki et al. | |
| 6,613,620 B2 | 9/2003 | Fujimoto et al. | |
| 6,677,613 B1 | 1/2004 | Yamazaki et al. | |
| 6,720,577 B2 | 4/2004 | Araot et al. | |
| 6,747,289 B2 | 6/2004 | Yamazaki et al. | |
| 6,777,716 B1 | 8/2004 | Yamazaki et al. | |
| 6,789,910 B2 | 9/2004 | Kimura et al. | |
| 6,825,488 B2 | 11/2004 | Yamazaki et al. | |
| 6,825,496 B2 * | 11/2004 | Yamazaki | H01L 27/3246 257/72 |
| 6,853,002 B2 | 2/2005 | Yamazaki et al. | |
| 6,900,460 B2 | 5/2005 | Yamazaki et al. | |
| 6,953,951 B2 | 10/2005 | Yamazaki et al. | |
| 6,955,953 B2 | 10/2005 | Yamazaki et al. | |
| 6,967,129 B2 | 11/2005 | Yamazaki et al. | |
| 7,023,021 B2 | 4/2006 | Yamazaki et al. | |
| 7,151,015 B2 | 12/2006 | Suzawa et al. | |
| 7,161,176 B2 | 1/2007 | Yamazaki et al. | |
| 7,223,621 B2 | 5/2007 | Kim | |
| 7,262,432 B2 | 8/2007 | Yamazaki et al. | |
| 8,039,853 B2 * | 10/2011 | Yamazaki | H01L 27/3246 257/89 |
| 8,779,431 B2 * | 7/2014 | Yamazaki | H01L 27/3246 257/59 |
| 8,952,385 B1 | 2/2015 | Yamazaki et al. | |
| 9,324,775 B2 * | 4/2016 | Yamazaki | H01L 27/3246 |
| 2002/0011799 A1 | 1/2002 | Kimura | |
| 2002/0070913 A1 | 6/2002 | Kimura et al. | |
| 2002/0195603 A1 | 12/2002 | Arao et al. | |
| 2005/0007494 A1 | 1/2005 | Yamazaki et al. | |
| 2005/0040401 A1 | 2/2005 | Yamazaki et al. | |
| 2005/0073241 A1 | 4/2005 | Yamauchi et al. | |
| 2005/0073242 A1 | 4/2005 | Yamauchi et al. | |
| 2005/0082970 A1 | 4/2005 | Yamazaki et al. | |
| 2007/0164290 A1 | 7/2007 | Yamazaki et al. | |
| 2007/0200113 A1 | 8/2007 | Yamazaki et al. | |

FOREIGN PATENT DOCUMENTS

| | | |
|---|---|---|
| JP | 64-081262 A | 3/1989 |
| JP | 02-044317 A | 2/1990 |
| JP | 10-319872 A | 12/1998 |
| JP | 2000-231347 A | 8/2000 |
| JP | 2000-284722 A | 10/2000 |
| JP | 2000-286426 A | 10/2000 |
| JP | 2000-299469 A | 10/2000 |
| JP | 2000-312007 A | 11/2000 |
| JP | 2000-315734 A | 11/2000 |
| JP | 2001-007335 A | 1/2001 |

OTHER PUBLICATIONS

Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.

Tsutsui.T et al., "Electroluminescence in Organic Thin Films", Photochemical Processes in Organized Molecular Systems, 1991, pp. 437-450.

Tsutsui.T et al., "High Quantum Efficiency in Organic Light-Emitting Devices With Iridium-Complex As a Triplet Emissive Center", Jpn. J. Appl. Phys. (Japanese Journal of Applied Physics), Dec. 15, 1999, vol. 38, No. 12B, pp. L1502-L1504.

* cited by examiner

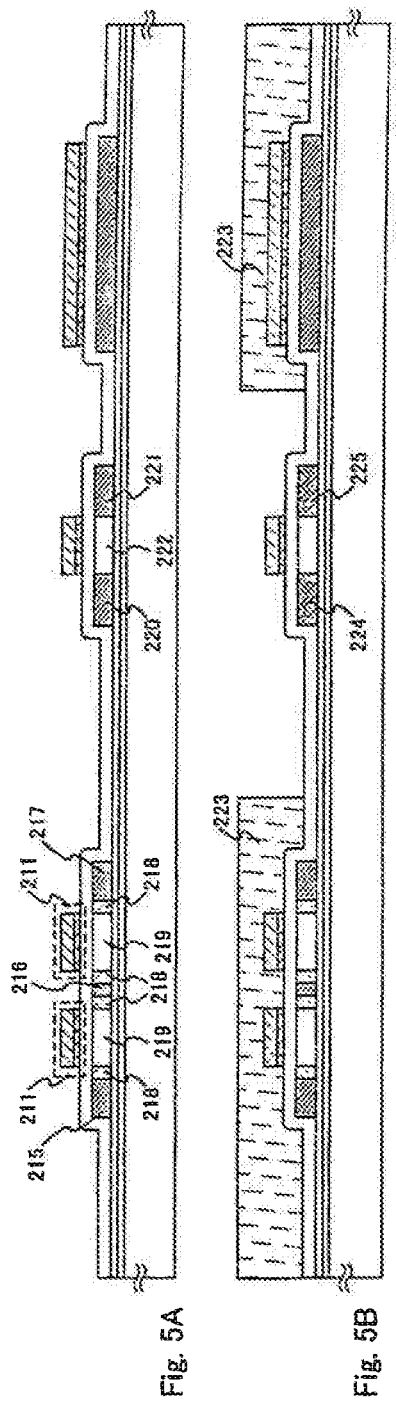
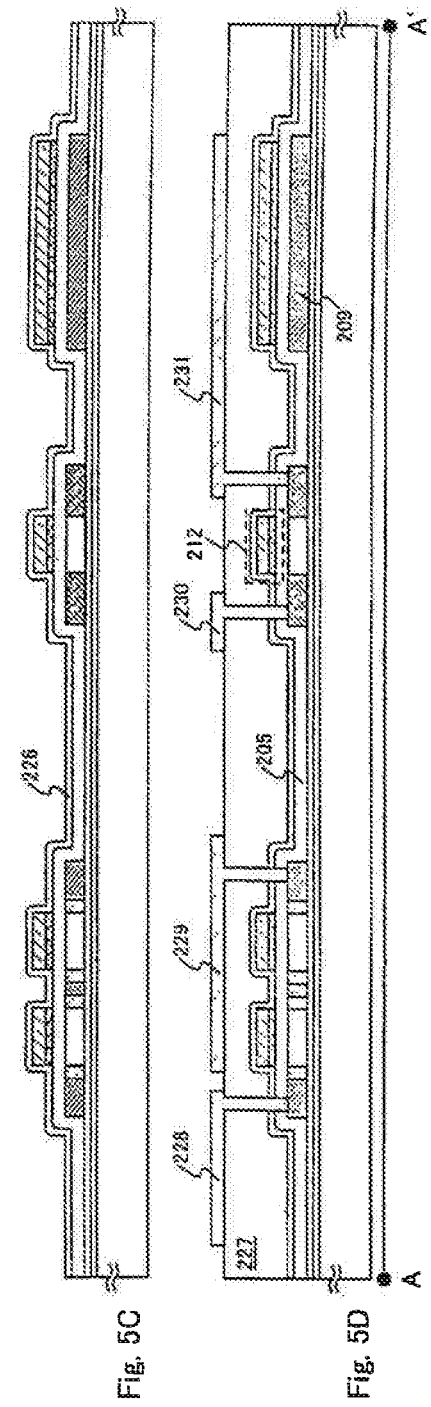
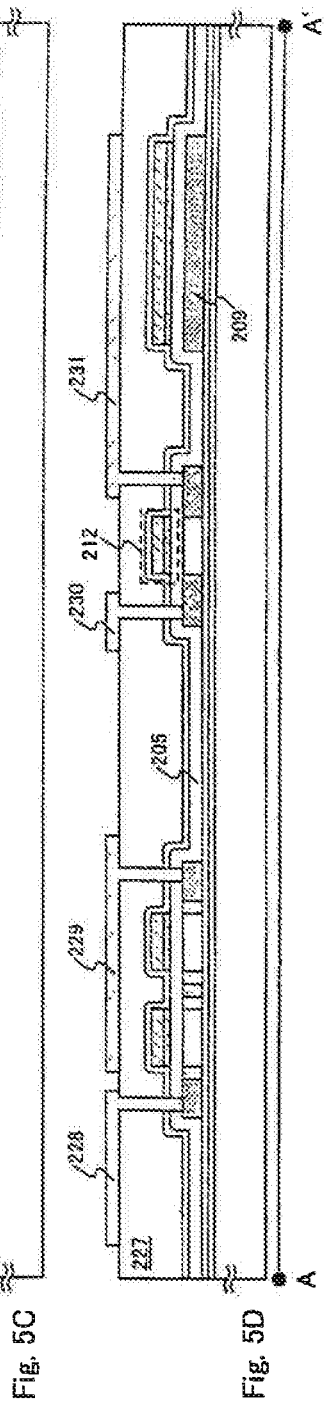
Fig. 5A
Fig. 5B
Fig. 5C
Fig. 5D

LIGHT EMITTING DEVICE

CROSS-REFERENCE TO RELATED APPLICATIONS

This application is a continuation of U.S. application Ser. No. 15/134,468, filed Apr. 21, 2016, now allowed, which is a continuation of U.S. application Ser. No. 14/920,972, filed Oct. 23, 2015, now U.S. Pat. No. 9,324,775, which is a continuation of U.S. application Ser. No. 14/614,502, filed Feb. 5, 2015, now U.S. Pat. No. 9,171,896, which is a continuation of U.S. application Ser. No. 14/322,990, filed Jul. 3, 2014, now U.S. Pat. No. 8,952,385, which is a continuation of U.S. application Ser. No. 14/037,437, filed Sep. 26, 2013, now U.S. Pat. No. 8,779,431, which is a continuation of U.S. application Ser. No. 13/555,292, filed Jul. 23, 2012, now U.S. Pat. No. 8,546,825, which is a continuation of U.S. application Ser. No. 13/241,351, filed Sep. 23, 2011, now U.S. Pat. No. 8,237,179, which is a continuation of U.S. application Ser. No. 12/879,032, filed Sep. 10, 2010, now U.S. Pat. No. 8,039,853, which is a continuation of U.S. application Ser. No. 11/773,172, filed Jul. 3, 2007, now U.S. Pat. No. 7,808,002, which is a continuation of U.S. application Ser. No. 10/986,931, filed Nov. 15, 2004, now U.S. Pat. No. 7,242,024, which is a continuation of U.S. application Ser. No. 10/050,597, filed Jan. 15, 2002, now U.S. Pat. No. 6,825,496, which claims the benefit of a foreign priority application filed in Japan as Serial No. 2001-008379 on Jan. 17, 2001, all of which are incorporated by reference.

BACKGROUND OF THE INVENTION

1. Field of the Invention

The present invention relates to an OLED (organic light emitting diode) panel in which an OLED formed over a substrate is sealed between the substrate and a sealing member. The invention also relates to an OLED module obtained by mounting an IC to the OLED panel. In this specification, a light emitting device is used as the generic term for the OLED panel and the OLED module. Also included in the present invention is electronic appliance using the light emitting device.

2. Description of the Related Art

Being self-luminous, OLEDs eliminate the need for a backlight that is necessary in liquid crystal display devices (LCDs) and thus make it easy to manufacture thinner devices. Also, the self-luminous OLEDs are high in visibility and have no limit in terms of viewing angle. These are the reasons for attention that light emitting devices using the OLEDs are receiving in recent years as display devices to replace CRTs and LCDs.

An OLED has a layer containing an organic compound that provides luminescence (electro luminescence) when an electric field is applied (the layer is hereinafter referred to as organic light emitting layer), in addition to an anode layer and a cathode layer. Luminescence obtained from organic compounds is classified into light emission upon return to the base state from singlet excitation (fluorescence) and light emission upon return to the base state from triplet excitation (phosphorescence). A light emitting device according to the present invention can use one or both types of light emission.

In this specification, all the layers that are provided between an anode and a cathode is defined as an organic light emitting layer. Specifically, the organic light emitting layer includes a light emitting layer, a hole injection layer, an electron injection layer, a hole transporting layer, an electron transporting layer, etc. A basic structure of an OLED is a laminate of an anode, a light emitting layer, and a cathode layered in this order. The basic structure can be modified into a laminate of an anode, a hole injection layer, a light emitting layer, and a cathode layered in this order, or a laminate of an anode, a hole injection layer, a light emitting layer, an electron transporting layer, and a cathode layered in this order.

One of methods of driving a light emitting device having an OLED is analog driving in which an analog video signal is used.

In analog driving, an analog video signal is inputted to a gate electrode of a TFT that controls a current flowing into the OLED (driving TFT). The amount of drain current of the driving TFT is controlled by the electric potential of the inputted analog video signal. When the drain current flows into the OLED, the OLED emits light at a luminance determined in accordance with the amount of the drain current. A gray scale is thus obtained.

A detailed description will be given with reference to FIG. 19 on how the amount of current supplied to the OLED is controlled by the gate voltage of the driving TFT in the above analog driving.

FIG. 19 is a graph showing a transistor characteristic of the driving TFT. The characteristic is called $I_{DS}$-$V_{GS}$ characteristic (or $I_{DS}$-$V_{GS}$ curve). $I_{DS}$ represents the drain current and $V_{GS}$ represents the voltage between the gate electrode and the source region (gate voltage). $V_{TH}$ represents the threshold voltage and $V\infty$ means that $V_{GS}$ is infinite From the graph, one can tell how much current flows when the gate voltage takes an arbitrary value.

An exclusive relation is formed between gate voltage and drain current in accordance with the $I_{DS}$-$V_{GS}$ characteristic shown in FIG. 19. In other words, the drain current is determined in accordance with the electric potential of an analog video signal inputted to the gate electrode of the driving TFT. The drain current flows into the OLED, which emits light at a luminance determined in accordance with the amount of the drain current.

When the voltage between the source region and the drain region is given as $V_{DS}$, the transistor characteristic of the driving TFT which is shown in FIG. 19 is divided into two ranges by values of $V_{GS}$ and $V_{DS}$. A range where $|V_{GS}-V_{TH}|<|V_{DS}|$ is satisfied is a saturation range, whereas a range where $|V_{GS}-V_{TH}|>|V_{DS}|$ is satisfied is a linear range.

The following equation 1 is satisfied in the saturation range.

$$I_{DS}=\beta(V_{GS}-V_{TH})^2/2 \qquad \text{Equation 1}$$

wherein $\beta=\mu C_O W/L$, $\mu$ represents the mobility, Co represents the gate capacitance per unit area, and W/L represents the ratio of a channel width W to a channel length L of a channel formation region.

As Equation 1 shows, the current value in the saturation range is hardly changed by $V_{DS}$ and is determined solely by $V_{GS}$. Therefore, it is relatively easy to control the gray scale by the electric potential of an analog signal. Accordingly, the driving TFT is operated mainly in the saturation range in analog driving in general.

In the saturation range, however, a change in gate voltage causes an exponential change in drain current as is apparent in FIG. 19. For that reason, the drain current in analog driving could be changed greatly by the slightest change in gate voltage due to leakage or other causes during a period started with input of an analog video signal and ending with input of the next analog video signal. A great change in drain current is accompanied by a great change in luminance of the OLED. This can therefore lead to a problem of flickering of screen, depending on the frame frequency.

In order to avoid the problem above, it is important to hold the gate voltage securely. Increasing the capacity of the capacitor storage can be one of measures for holding the gate voltage securely. However, when the capacitor storage is increased, the aperture ratio is lowered to reduce the area of a pixel where light emission is actually obtained (area of effective light emission). The term area of effective light emission refers to the area of a region in which light emitted from an OLED is not blocked by objects that do not transmit light, such as a TFT and wiring line formed on the substrate.

In recent years in particular, demands for images of higher definition are increasing and how to solve the problem of lowered aperture ratio which accompanies enhancement of pixel definition is becoming ever important. Accordingly, increasing the area that a capacitor storage occupies in a pixel is not desirable.

SUMMARY OF THE INVENTION

The present invention has been made in view of the problems above, and an object of the present invention is therefore to provide a light emitting device which can prevent a change in gate voltage due to leakage or other causes and at the same time can prevent the aperture ratio from lowering.

In order to attain the above object, the present invention uses a connection wiring line, an insulating film, and a capacitance wiring line to form a capacitor storage. The connection wiring line is formed over a gate electrode and an active layer of a TFT of a pixel, and is connected to the active layer. The insulating film is formed on the connection wiring line. The capacitance wiring line is formed on the insulating film. Alternatively, the capacitance wiring line may be formed on the same interlayer insulating film on which a pixel electrode is formed. In this case, the capacitance wiring line and the pixel electrode may be formed from the same conductive film. A power supply line may double as the capacitance wiring line.

This structure enables the capacitor storage to overlap the TFT, thereby increasing the capacity of the capacitor storage while keeping the aperture ratio from lowering. Accordingly, a change in gate voltage due to leakage or other causes can be controlled to prevent a change in luminance of an OLED and flickering of screen in analog driving.

Keeping the aperture ratio from lowering also leads to preventing the area of effective light emission of a pixel from being reduced. As the area of effective light emission is larger, the luminance of the screen is higher. Therefore, the structure of the present invention is effective in reducing power consumption.

The structure of the present invention may also be used in digital driving.

BRIEF DESCRIPTION OF THE DRAWINGS

In the accompanying drawings:

FIGS. 5A to 5D are diagrams showing a process of manufacturing a light emitting device of the present invention;

DETAILED DESCRIPTION OF THE PREFERRED EMBODIMENTS

Embodiment Mode

The structure of the present invention will be described below.

Figure 1:
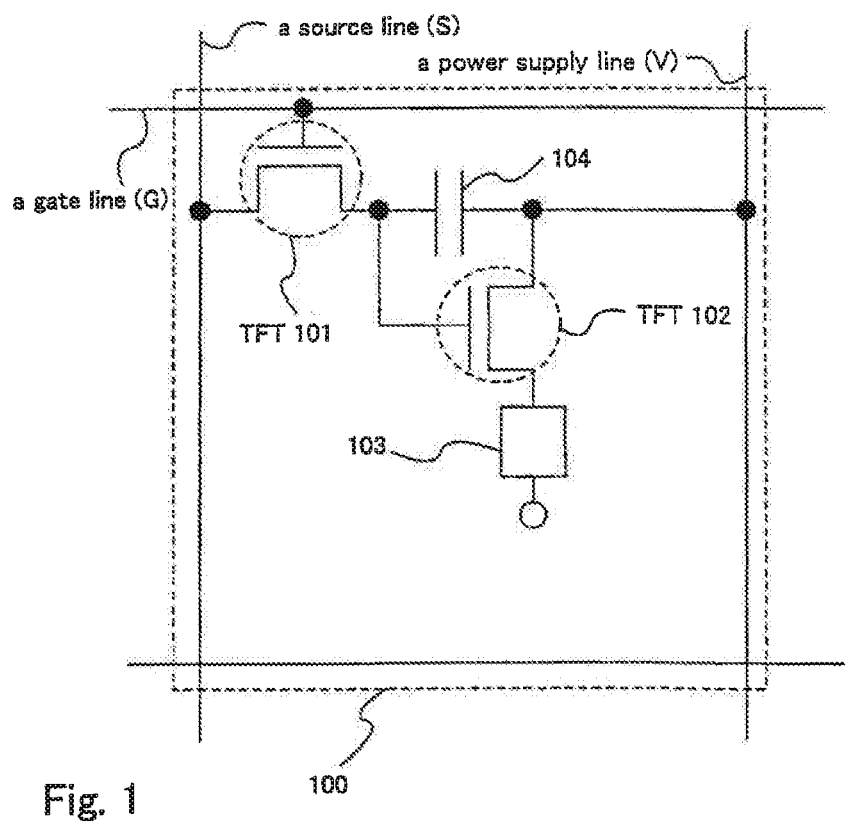
FIG. 1 is a circuit diagram of a pixel in a light emitting device of the present invention.

A light emitting device of the present invention has a pixel portion in which a plurality of pixels form a matrix. A description is given with reference to FIG. 1 on a connection structure in a TFT of a pixel of the present invention.

A region that has one of source lines (S), one of gate lines (G), and one of power supply lines (V) corresponds to a pixel 100. Each pixel has a switching TFT 101, a driving TFT 102, an OLED 103, and a capacitor storage 104.

A gate electrode of the switching TFT 101 is connected to the gate line (G). The switching TFT 101 has a source region and a drain region one of which is connected to the source line (S) and the other of which is connected to a gate electrode of the driving TFT 102.

The driving TFT has a source region and a drain region one of which is connected to the power supply line (V) and the other of which is connected to a pixel electrode of the OLED 103. If an anode of the OLED 103 is used as the pixel electrode, a cathode thereof is called an opposite electrode. If the cathode of the OLED 103 is used as the pixel electrode, on the other hand, the anode is called the opposite electrode.

The switching TFT 101 may be either a p-channel TFT or n-channel TFT. The driving TFT 102 may be either a p-channel TFT or n-channel TFT. However, it is desirable to use a p-channel TFT for the driving TFT when the anode serves as the pixel electrode. On the other hand, when the cathode serves as the pixel electrode, the driving TFT is desirably an n-channel TFT.

Of two electrodes that the capacitor storage has, one is electrically connected to the gate electrode of the driving TFT 102 and the other is electrically connected to the power supply line (V).

Next, a specific structure of the capacitor storage in the light emitting device of the present invention will be described with reference to FIG. 2. Denoted by 101 and 102 are a switching TFT and a driving TFT, respectively. The TFTs are formed on an insulating surface.

The switching TFT 101 has an active layer 130, which has impurity regions 110 and 111. The impurity regions are to function as a source region or a drain region. A gate electrode 114 is formed above the active layer 130 with a gate insulating film 116 interposed therebetween.

The driving TFT 102 has an active layer 131, which has impurity regions 112 and 113. The impurity regions are to function as a source region or a drain region. A gate electrode 115 is formed above the active layer 131 with the gate insulating film 116 interposed therebetween.

A first interlayer insulating film 133 and a second interlayer insulating film 117 are formed to cover the active layers 130 and 131 and the gate electrodes 114 and 115 of the switching TFT 101 and the driving TFT 102, and the gate insulating film 116. Although two interlayer insulating films, namely, the first interlayer insulating film 133 and the second interlayer insulating film 117, are formed in FIG. 2, the number of interlayer insulating films may be one. Formed on the second interlayer insulating film 117 are a source line (S), connection wiring lines 118 and 119, and a power supply line (V).

The source line (S) is connected to the impurity region 110 through a contact hole that is formed in the first interlayer insulating film 133, the second interlayer insulating film 117, and a gate insulating film 116. The connection wiring line 118 is connected to the impurity region 111 through a contact hole that is formed in the first interlayer insulating film 133, the second interlayer insulating film 117, and a gate insulating film 116.

The connection wiring line 119 is connected to the impurity region 112 through a contact hole that is formed in the first interlayer insulating film 133 and the second interlayer insulating film 117. The power supply line (V) is connected to the impurity region 113 through a contact hole that is formed in the first interlayer insulating film 133 and the second interlayer insulating film 117, the first interlayer insulating film 133, and a gate insulating film 116.

The connection wiring line 118 overlaps the active layer 130 with the second interlayer insulating film 117 interposed therebetween.

A third interlayer insulating film 120 is formed on the second interlayer insulating film 117 so as to cover the source line (S), the connection wiring lines 118 and 119, and the power supply line (V). On the third interlayer insulating film 120, a capacitance wiring line 121 and a pixel electrode 122 are formed.

The pixel electrode 122 is connected to the connection wiring line 119 through a contact hole that is formed in the third interlayer insulating film 120.

In the present invention, the capacitor storage 104 is formed in an area where the third interlayer insulating film 120 is sandwiched between the connection wiring line 118 and the capacitance wiring line 121. The capacitance wiring line 121 can be formed from the same conductive film as the pixel electrode 122 and, therefore, the capacitor storage can be formed without increasing the number of steps in manufacture process. The capacitor storage 104 is formed to overlap the active layer 130 of the switching TFT 101, which makes it possible to obtain a capacitor storage without reducing the aperture ratio.

A fourth interlayer insulating film 125 is formed on the third interlayer insulating film 120 so as to cover the capacitance wiring line 121 and the pixel electrode 122. The fourth interlayer insulating film 125 is partially etched to expose the pixel electrode 122.

An opposite electrode 124 is layered on an organic light emitting layer 123 so as to cover the pixel electrode 122 and the fourth interlayer insulating film 125. An area where the pixel electrode 122, the organic light emitting layer 123, and the opposite electrode 124 overlap corresponds to the OLED 103.

Figure 2:
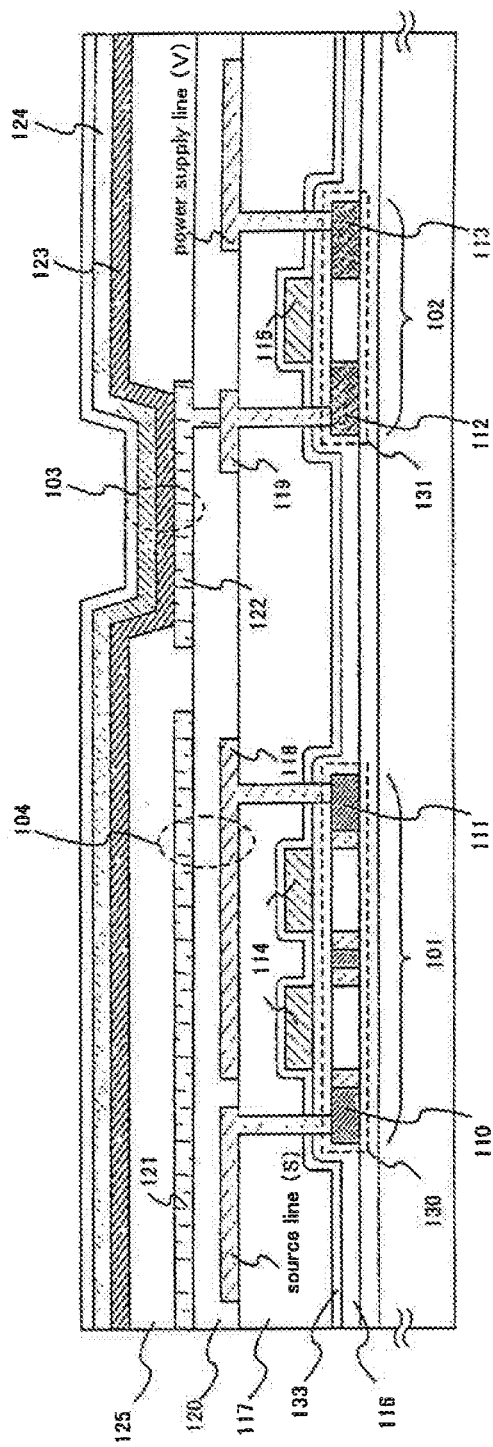
FIG. 2 is a sectional view of a pixel in a light emitting device of the present invention.
Figure 3:
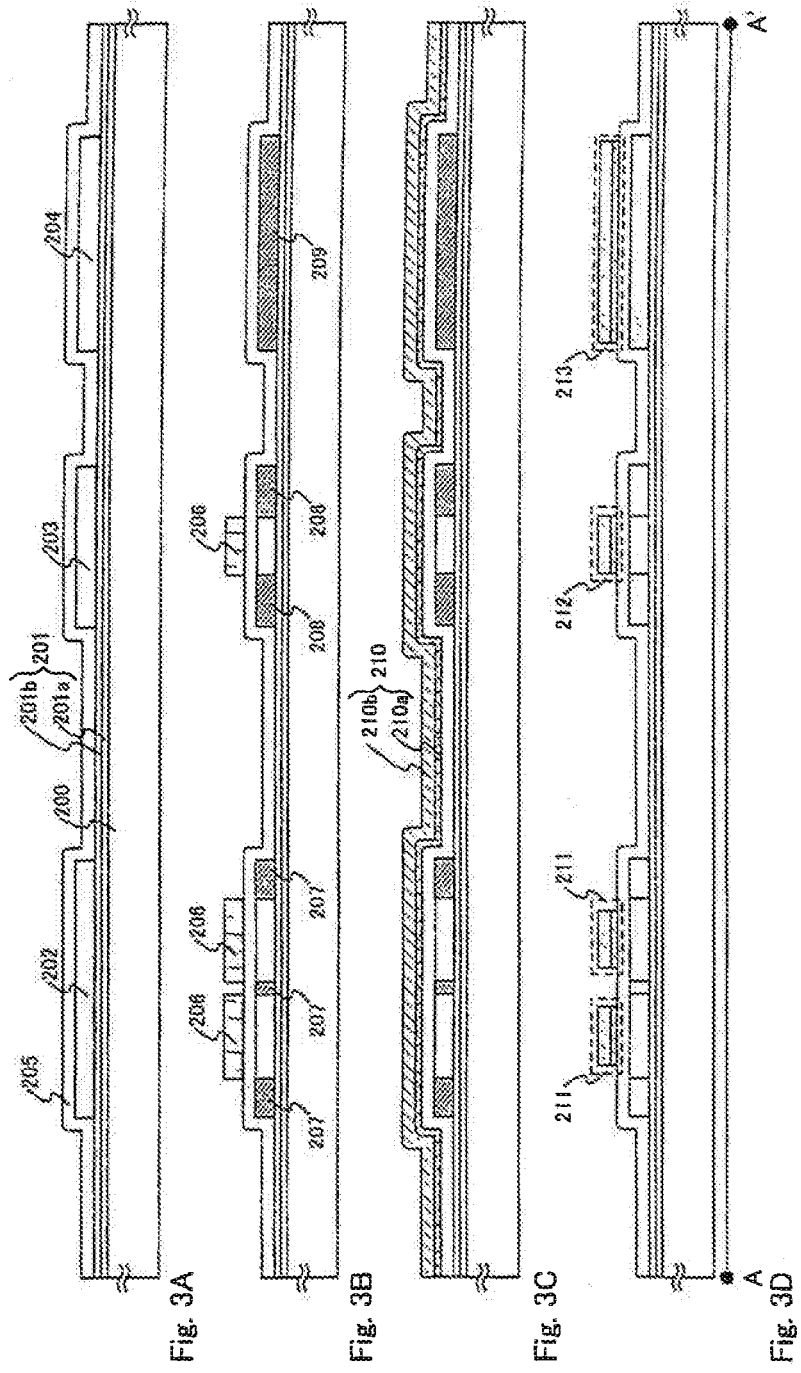
FIGS. 3A to 3D are diagrams showing a process of manufacturing a light emitting device of the present invention.

In the present invention, structures of the TFTs are not limited to those shown in FIG. 2. Also, the present invention may have, in addition to the capacitor storage 104 that is formed from the connection wiring line 118 and the capacitance wiring line 121, a capacitor storage of different structure.

In the pixel structure according to the present invention, the connection wiring line 118 is formed so as to overlap the active layer of the switching TFT 101. Therefore, OFF current is prevented from flowing in the switching TFT 101 when light emitted from the OLED, or light made incident from the outside of the light emitting device, is incident on the active layer 130.

Shown in FIG. 2 is the case where the switching TFT 101 is an n-channel TFT and the driving TFT 102 is a p-channel TFT, but the present invention is not limited thereto. The switching TFT 101 may be either a p-channel TFT or n-channel TFT, and the same applies to the driving TFT 102. However, it is desirable to use a p-channel TFT for the driving TFT in FIG. 2 since the pixel electrode 122 here serves as the anode.

This embodiment mode shows a case in which a pixel has two TFTs. However, the present invention is not limited thereto. A capacitor storage structured in accordance with the present invention can be formed irrespective of how many TFTs one pixel has. The capacitor storage of the present invention can be obtained as long as it is formed from: a wiring line (connection wiring line) that is formed over a gate electrode and an active layer of a TFT of a pixel and is connected to the active layer; an insulating film formed on the connection wiring line; and a wiring line (capacitance wiring line) formed on the insulating film.

With the above structure, the present invention can make the capacitor storage overlap the TFT and therefore can increase the capacity of the capacitor storage while keeping the aperture ratio from lowering. Accordingly, a change in gate voltage due to leakage or other causes can be avoided to thereby prevent a change in luminance of the OLED and flickering of screen in analog driving.

Keeping the aperture ratio from lowering also leads to preventing the area of effective light emission of a pixel from being reduced. As the area of effective light emission is larger, the luminance of the screen is higher. Therefore, the structure of the present invention is effective in reducing power consumption.

Embodiments of the present invention will be described below.

Embodiment 1

A description is given with reference to FIGS. 3A to 8 on an example of a method of manufacturing a light emitting device according to the present invention. The description is given step by step about details of a method of manufacturing TFTs in the pixel shown in FIG. 1.

First, a glass substrate 200 is prepared. Barium borosilicate glass, typical example of which is Corning #7059 glass or #1737 glass (product of Corning Incorporated), or alumino borosilicate glass is usable as the substrate 200. The substrate 200 can be any light-transmissive substrate, and a quartz substrate may also be used. A plastic substrate may be employed if it has heat resistance against the process temperature of this embodiment.

Next, as shown in FIG. 3A, a base film 201 is formed on the substrate 200 from an insulating film such as a silicon oxide film, a silicon nitride film, or a silicon oxynitride film. In this embodiment, the base film 201 has a two-layer structure. However, a single layer or more than two layers of the insulating films listed above may be used as the base film. The first layer of the base film 201 is a silicon oxynitride film 201a formed to have a thickness of 10 to 200 nm (preferably 50 to 100 nm) by plasma CVD using as reaction gas $SiH_4$, $NH_4$, and $N_2O$. The silicon oxynitride film 201a (composition ratio: Si=32%, O=27%, N=24%, H=17%) formed in this embodiment has a thickness of 50 nm. The second layer of the base film 201 is a silicon oxynitride film 201b formed to have a thickness of 50 to 200 nm (preferably 100 to 150 nm) by plasma CVD using as reaction gas $SiH_4$ and $N_2O$. The silicon oxynitride film 201b (composition ratio: Si=32%, O=59%, N=7%, H=2%) formed in this embodiment has a thickness of 100 nm.

On the base film 201, semiconductor layers 202 to 204 are formed. The semiconductor layers 202 to 204 are formed by patterning into a desired shape a crystalline semiconductor film that is obtained by forming a semiconductor film with an amorphous structure through a known method (sputtering, LPCVD, plasma CVD, or the like) and then subjecting the film to known crystallization treatment (e.g., laser crystallization, thermal crystallization, or thermal crystallization using nickel or other catalysts). The semiconductor layers 202 to 204 are each 25 to 80 nm in thickness (preferably 30 to 60 nm). The material of the crystalline semiconductor film is not limited but silicon or a silicon germanium ($Si_xGe_{1-x}$ (X=0.0001 to 0.02)) alloy is preferable. In this embodiment, an amorphous silicon film with a thickness of 55 nm is formed by plasma CVD and then a solution containing nickel is held to the top face of the amorphous silicon film. The amorphous silicon film is subjected to dehydrogenation (at 500° C., for an hour), then to thermal crystallization (at 550° C., for four hours), and then to laser annealing treatment for improvement of crystallinity to obtain a crystalline silicon film Patterning treatment using photolithography is conducted on this crystalline silicon film to form the semiconductor layers 202 to 204.

The semiconductor layers 202 to 204 may be doped with a minute amount of impurity element (boron or phosphorus) in order to control the threshold of the TFTs.

If laser crystallization is used to form the crystalline semiconductor film, a pulse oscillating or continuous wave excimer laser, YAG laser, or $YVO_4$ laser can be employed. Laser light emitted from these laser oscillators is preferably collected into a linear beam by an optical system before irradiating the semiconductor film. Though conditions of crystallization can be set suitably by an operator, there are some preferred conditions. When an excimer laser is used, preferable conditions include setting the pulse oscillation frequency to 300 Hz, and the laser energy density to 100 to 400 mJ/cm² (typically, 200 to 300 mJ/cm²). When a YAG laser is used, preferable conditions include using the second harmonic thereof, and setting the pulse oscillation frequency to 30 to 300 kHz and the laser energy density to 300 to 600 mJ/cm² (typically, 350 to 500 mJ/cm²). The laser light is collected into a linear beam having a width of 100 to 1000 μm, 400 μm, for example, to irradiate the entire surface of the substrate with the beam. In the irradiation, the overlap ratio of the linear laser light is set to 50 to 98%.

Next, a gate insulating film 205 is formed to cover the semiconductor layers 202 to 204. The gate insulating film 205 is formed from an insulating film containing silicon by plasma CVD or sputtering to have a thickness of 40 to 150 nm. This embodiment uses a silicon oxynitride film (composition ratio: Si=32%, O=59%, N=7%, H=2%) formed by plasma CVD to have a thickness of 110 nm. The gate insulating film is not limited to the silicon oxynitride film, of course, but may be a single layer or a laminate of other insulating films containing silicon.

When a silicon oxide film is used for the gate insulating film, the film is formed by plasma CVD in which TEOS (tetraethyl orthosilicate) and $O_2$ are mixed, the reaction pressure is set to 40 Pa, the substrate temperature is set to 300 to 400° C., and the high frequency (13.56 MHz) power density is set to 0.5 to 0.8 W/cm² for electric discharge. The silicon oxide film thus formed can provide excellent characteristics as the gate insulating film when the film receives subsequent thermal annealing at 400 to 500° C. The device that has finished the steps above presents the sectional view shown in FIG. 3A.

Resist masks 206 are formed next and the semiconductor layers are doped with an n type impurity element (phosphorus, in this embodiment) to form impurity regions 207 to 209 that contain high concentration of phosphorus. These regions each contain phosphorus in a concentration of $1 \times 10^{20}$ to $5 \times 10^{21}$ atoms/cm³, typically, $2 \times 10^{20}$ to $1 \times 10^{22}$ atoms/cm³ (FIG. 3B).

A heat-resistant conductive layer for forming a gate electrode is formed on the gate insulating film 205 (FIG. 3C). A heat-resistant conductive layer 210 may be a single layer or a laminate of two, three, or more layers if necessary. In this embodiment, a laminate of a conductive film (A) 210a and a conductive film (B) 210b makes the heat-resistant conductive layer. The heat-resistant conductive layer may be a film containing an element selected from the group consisting of tantalum (Ta), titanium (Ti), molybdenum (Mo), tungsten (W), chromium (Cr), and silicon (Si). Alternatively, the heat-resistant conductive layer may be a conductive film mainly containing one of the elements listed above (typically a tantalum nitride film, a tungsten nitride film, a titanium nitride film, or the like), or an alloy film containing a combination of the elements listed above (typically a Mo—W alloy film, a Mo—Ta alloy film, a tungsten silicide film, or the like). This embodiment uses a TaN film for the conductive film (A) 210a and a W film for the conductive film (B) 210b. These films that constitute the heat-resistant conductive layer are formed by sputtering or CVD. In order to reduce the resistance of the films, the concentration of impurities contained in the films should be lowered and the oxygen concentration in particular is preferably reduced to 30 ppm or less. The W film may be formed by sputtering with W as the target, or by thermal CVD using tungsten hexafluoride ($WF_6$). In either case, the W film has to have a low resistivity in order to use the W film as a gate electrode. A desirable resistivity of the W film is 20 μΩcm or lower. The resistivity of the W film can be reduced by increasing the crystal grain size but, if there are too many impurity elements such as oxygen in the W film, crystallization is inhibited to raise the resistivity. Accordingly, when the W film is formed by sputtering, a W target with a purity of 99.99% or 99.9999% is used and a great care is taken not to allow impurities in the air to mix in the W film that is being formed. As a result, the W film can have a resistivity of 9 to 20 μΩcm.

Sputtering can also be used to form a Ta film for the heat-resistant conductive layer 210. The Ta film is formed by using Ar as sputtering gas. If an appropriate amount of Xe or Kr is added to the sputtering gas, the internal stress of the obtained Ta film is eased to prevent the Ta film from peeling off. The resistivity of a Ta film in α phase is about 20 μΩcm and is usable as a gate electrode. On the other hand, the resistivity of a Ta film in β phase is about 180 μΩcm and is not suitable for a gate electrode. A Ta film in α phase can readily be obtained by forming, as a base of a Ta film, a TaN film that has a crystal structure approximate to that of the α phase. Though not shown in the drawings, it is effective to form a silicon film doped with phosphorus (P) to have a thickness of 2 to 20 nm under the heat-resistant conductive layer 210. This improves adherence to the conductive film to be formed thereon and prevents oxidization. At the same time, the silicon film prevents a minute amount of alkaline metal element contained in the heat-resistant conductive layer 210 from diffusing into the first shape gate insulating film 205. Whatever material is used, a preferable resistivity range for the heat-resistant conductive layer 210 is 10 to 50 μΩcm.

The conductive film (A) 210a and the conductive film (B) 210b are then patterned into desired shapes to form gate electrodes 211 and 212 and a capacitance electrode 213 (FIG. 3D). Though not clear in FIG. 3D, the capacitance electrode 213 is connected to the gate electrode 212.

Figure 4:
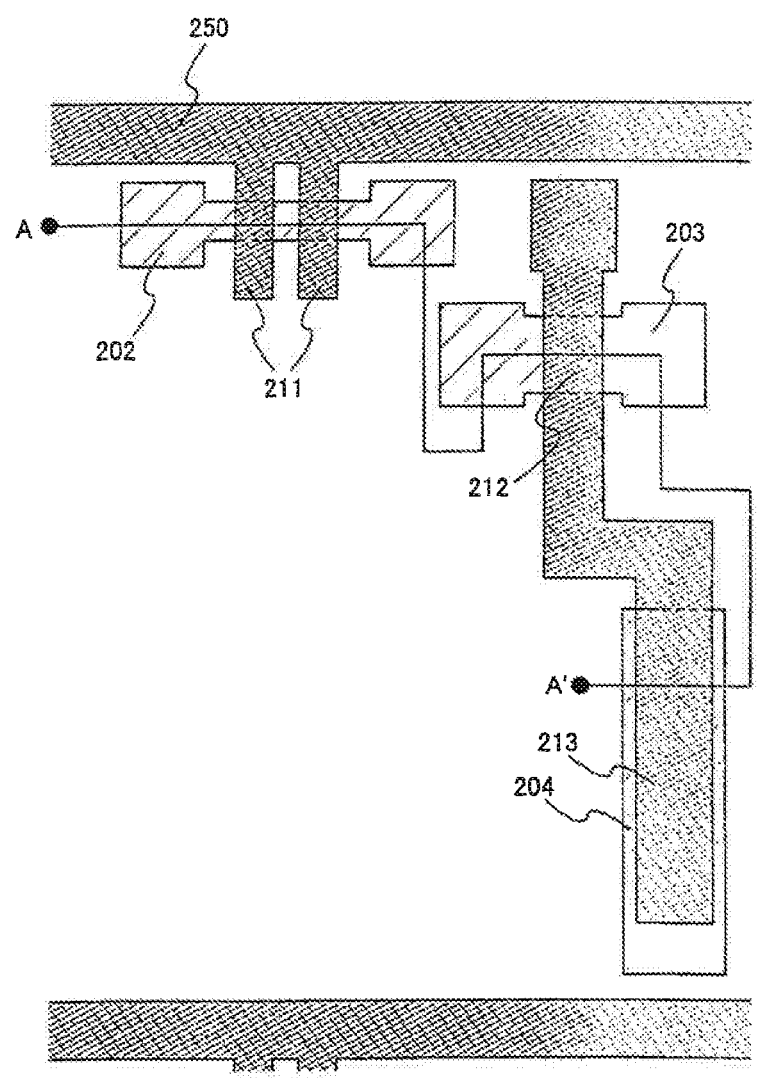
FIG. 4 is a top view of a light emitting device of the present invention.

A top view of the pixel that has finished the step of FIG. 3D is shown in FIG. 4. FIG. 3D corresponds to the sectional view of the pixel taken along the line A-A' in FIG. 4. Note that the gate insulating film 205 is omitted here for clearer view. Denoted by 250 is a gate line that is connected to the gate electrode 211.

Using the gate electrode 211 as a mask, the semiconductor layers 202 and 203 that are to serve as active layers of TFTs are doped with an impurity element for imparting the n type conductivity (hereinafter referred to as n type impurity element). Elements usable as the n type impurity element are ones belonging to Group 15 in the periodic table, typically, phosphorus or arsenic. Formed through this doping step are first impurity regions 215 to 217, 220, and 221, a second impurity region 218, and channel formation regions 219 and 222. One of the first impurity regions 215 and 217 functions as a source region whereas the other functions as a drain region. The second impurity region 218 is a low concentration impurity region that functions as an LDD region, and contains the n type impurity element in a concentration of $1 \times 10^{16}$ to $5 \times 10^{18}$ atoms/cm$^3$, typically, $1 \times 10^{17}$ to $5 \times 10^{18}$ atoms/cm$^3$ (FIG. 5A).

The regions for forming n-channel TFTs are covered with masks 223 to dope the semiconductor layer 203 that is to serve as an active layer of a p-channel TFT with boron as a p type impurity element. The concentration of boron is set to $3 \times 10^{20}$ to $3 \times 10^{21}$ atoms/cm$^3$, typically, $5 \times 10^{20}$ to $1 \times 10^{21}$ atoms/cm$^3$ (FIG. 5B). Through this step, third impurity regions 224 and 225 are formed in the semiconductor layer 203.

Next, a first interlayer insulating film 226 is formed on the gate electrodes 211 and 212, the capacitance electrode 213, and the gate insulating film 205. The first interlayer insulating film 226 may be a silicon oxide film, a silicon oxynitride film, or a silicon nitride film, or may be a laminate having these insulating films in combination. In any case, the first interlayer insulating film 226 is formed from an inorganic insulating material. The thickness of the first interlayer insulating film 226 is set to 100 to 200 nm. If a silicon oxide film is used for the first interlayer insulating film 226, the film is formed by plasma CVD in which TEOS and O$_2$ are mixed, the reaction pressure is set to 40 Pa, the substrate temperature is set to 300 to 400° C., and the high frequency (13.56 MHz) power density is set to 0.5 to 0.8 W/cm$^2$ for electric discharge. If a silicon oxynitride film is used for the first interlayer insulating film 226, the film may be formed by plasma CVD from SiH$_4$, N$_2$O, and NH$_3$, or from SiH$_4$ and N$_2$O. The film formation conditions in this case include setting the reaction pressure to 20 to 200 Pa, the substrate temperature to 300 to 400° C., and the high frequency (60 MHz) power density to 0.1 to 1.0 W/cm$^2$. The first interlayer insulating film 226 may be a silicon oxynitride hydrate film formed from SiH$_4$, N$_2$O, and H$_2$. A silicon nitride film as the first interlayer insulating film can be formed similarly by plasma CVD from SiH$_4$ and NH$_3$.

Then an activation step is conducted to activate the impurity elements that are used to dope the semiconductor layers in different concentrations and impart them the n type or p type conductivity (FIG. 5C). The conductive films used as the gate electrodes in this embodiment are easily oxidized and the resistivity thereof is raised as a result of oxidization. Accordingly, heat treatment for activation in this embodiment is conducted preferably under reduced pressure atmosphere by evacuation using a rotary pump or mechanical booster pump to reduce the oxygen concentration in the atmosphere.

Next, dangling bonds in the active layers are terminated through hydrogenation using thermally excited hydrogen. The hydrogenation is achieved by heat treatment in a hydrogen atmosphere at 410° C. for an hour. Other hydrogenation means include plasma hydrogenation that uses hydrogen excited by plasma.

Then, a second interlayer insulating film 227 is formed to have a thickness of 500 to 1000 nm (800 nm, in this embodiment). The second interlayer insulating film 227 may be an organic insulating film such as an acrylic film, a polyimide film, a polyamide film, or a BCB (benzocyclobutene) film, or an inorganic insulating film such as a silicon oxynitride film or a silicon nitride oxide film.

Thereafter, a resist mask of a given pattern is formed to form contact holes reaching the first impurity regions 215 and 217, the third impurity regions 224 and 225, and the impurity region 209. The contact hole reaching the impurity region 209 is omitted in FIG. 5D. The contact holes are formed by dry etching. In this case, a mixture of CF$_4$, O$_2$, and He is used as etching gas to etch the second interlayer insulating film 227 first. The etching gas is then changed to a mixture of CF$_4$ and O$_2$ to etch the first interlayer insulating film 226. The etching gas is further changed to CHF$_3$ in order to enhance the selective ratio with the semiconductor layers, and the gate insulating film 205 is etched. Thus, the contact holes are formed.

A metal conductive film is formed by sputtering or vacuum evaporation and patterned using a mask. The film is then etched to form a source line 228, connection wiring lines 229 and 230, and a power supply line 231. The source line 228 is connected to the first impurity region 215. The connection wiring line 229 is connected to the first impurity region 217. The connection wiring line 230 is connected to the third impurity region 224. The power supply line 231 is connected to the third impurity region 225. Though not shown in FIG. 5D, the connection wiring line 229 is connected to the gate electrode 212 and the power supply line 231 is connected to the impurity region 209.

The wiring lines in this embodiment are formed from a laminate of a Ti film with a thickness of 50 nm and an alloy film (Al—Ti alloy film) with a thickness of 500 nm, though not shown in FIG. 5D.

Figure 6:
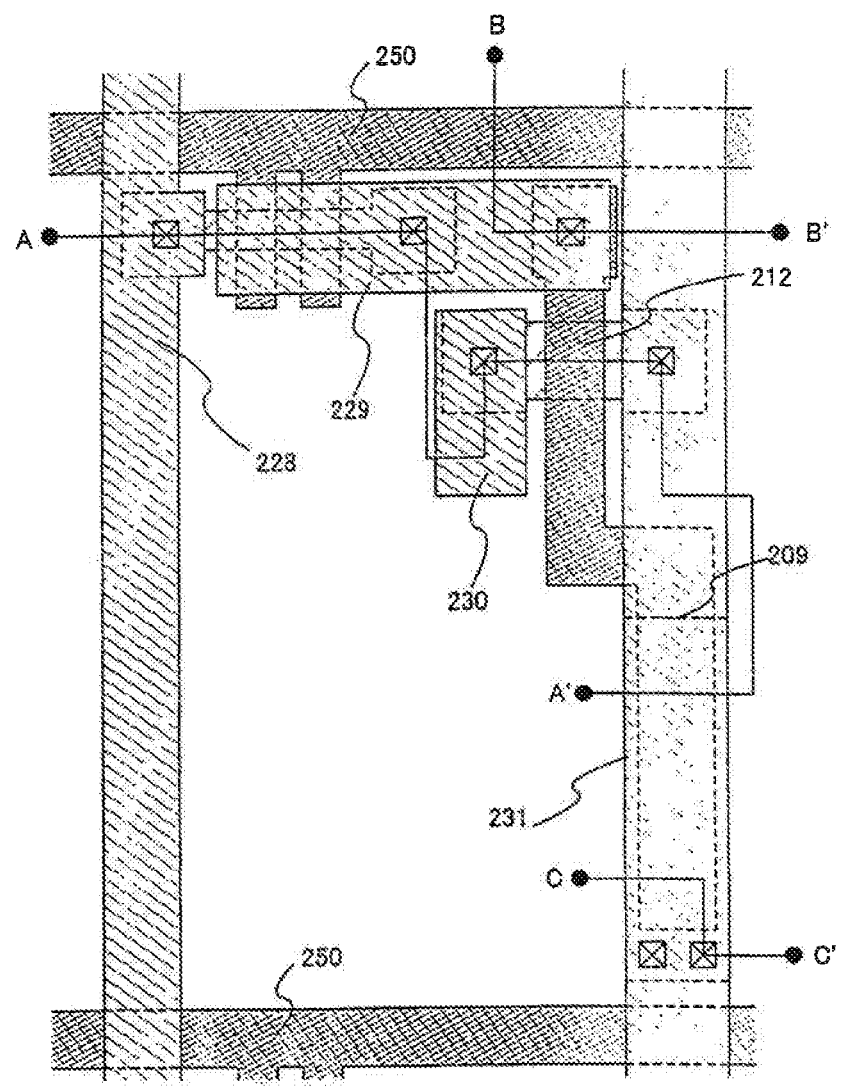
FIG. 6 is a top view of a light emitting device of the present invention.

A top view of the pixel that has finished the step of FIG. 5D is shown in FIG. 6. FIG. 5D corresponds to the sectional view of the pixel taken along the line A-A' in FIG. 6. Note that the gate insulating film 205 and the first and second interlayer insulating film 226 and 227 are omitted here for clearer view. Denoted by 250 is a gate line.

Figure 20A:
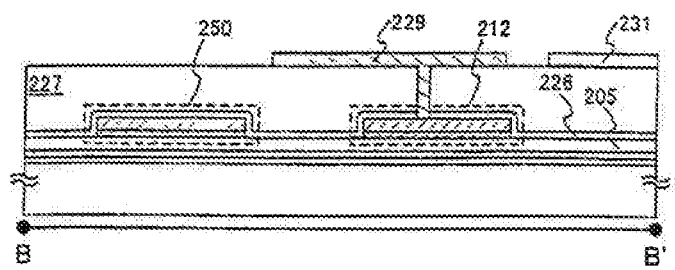
FIGS. 20A and 20B are sectional views of a pixel in a light emitting device of the present invention.

The connection between the connection wiring line 229 and the gate electrode 212 is illustrated in FIG. 20A. FIG. 20A corresponds to the sectional view of the pixel taken along the line B-B' in FIG. 6. The connection wiring line 229 is connected to the gate electrode 212 through the contact hole that is formed in the second interlayer insulating film 227 and the first interlayer insulating film 226.

Figure 20B:
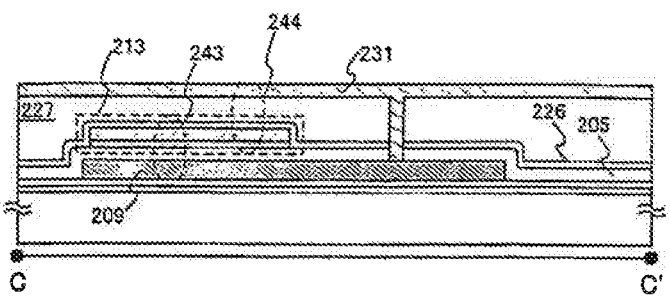

The connection between the power supply line 231 and the impurity region 209 is illustrated in FIG. 20B. FIG. 20B corresponds to the sectional view of the pixel taken along the line C-C' in FIG. 6. The power supply line 231 is connected to the impurity region 209 through the contact hole that is formed in the second interlayer insulating film 227 and the first interlayer insulating film 226.

Figure 7A:
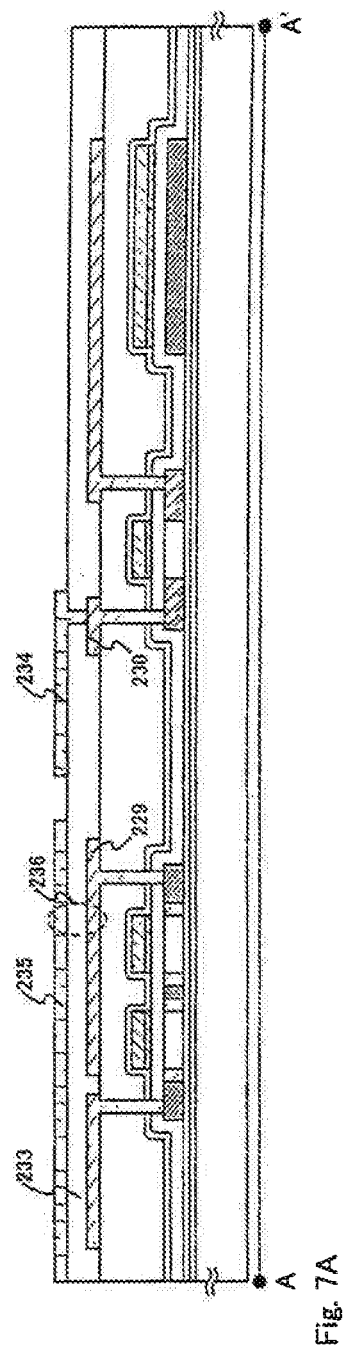
FIGS. 7A and 7B are diagrams showing a process of manufacturing a light emitting device of the present invention.

A third interlayer insulating film 233 is formed next. For the need of planarization, the third interlayer insulating film 233 is formed from an organic insulating film such as a polyimide film or an acrylic film to have a thickness of 1.5 μm. A contact hole reaching the connection wiring line 230 is formed in the third interlayer insulating film 233. A transparent conductive film with a thickness of 80 to 120 nm is formed on the third interlayer insulating film 233 and then patterned. Thus formed are a pixel electrode 234 and a capacitance wiring line 235 (FIG. 7A). The transparent conductive film used in this embodiment is an indium tin oxide (ITO) film or a film obtained by mixing 2 to 20% of zinc oxide (ZnO) with indium oxide.

The capacitance wiring line 235 overlaps the connection wiring line 229 with the third interlayer insulating film 233 interposed therebetween. In the present invention, a capacitor storage 236 is formed from the capacitance wiring line 235, the third interlayer insulating film 233, and the connection wiring line 229.

Figure 8:
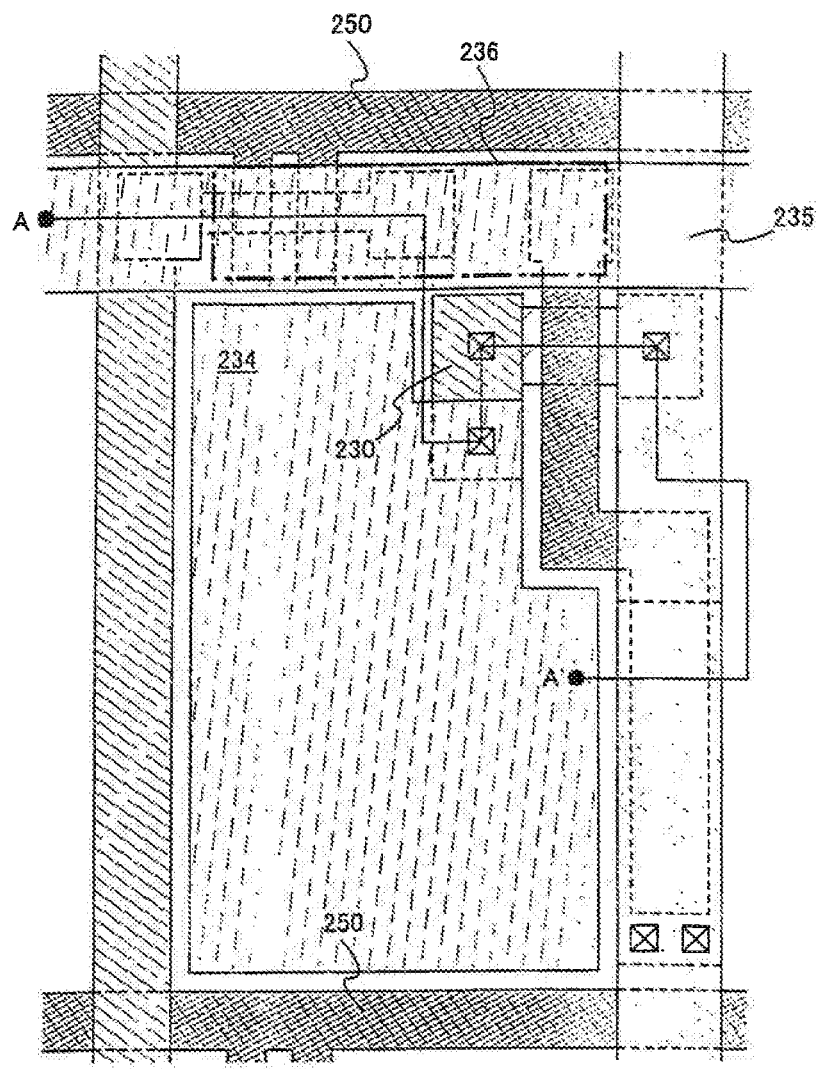
FIG. 8 is a top view of a light emitting device of the present invention.

A top view of the pixel that has finished the step of FIG. 7A is shown in FIG. 8. FIG. 7A corresponds to the sectional view of the pixel taken along the line A-A' in FIG. 8. Note that the third interlayer insulating film 233 is omitted here for clearer view.

Figure 9:
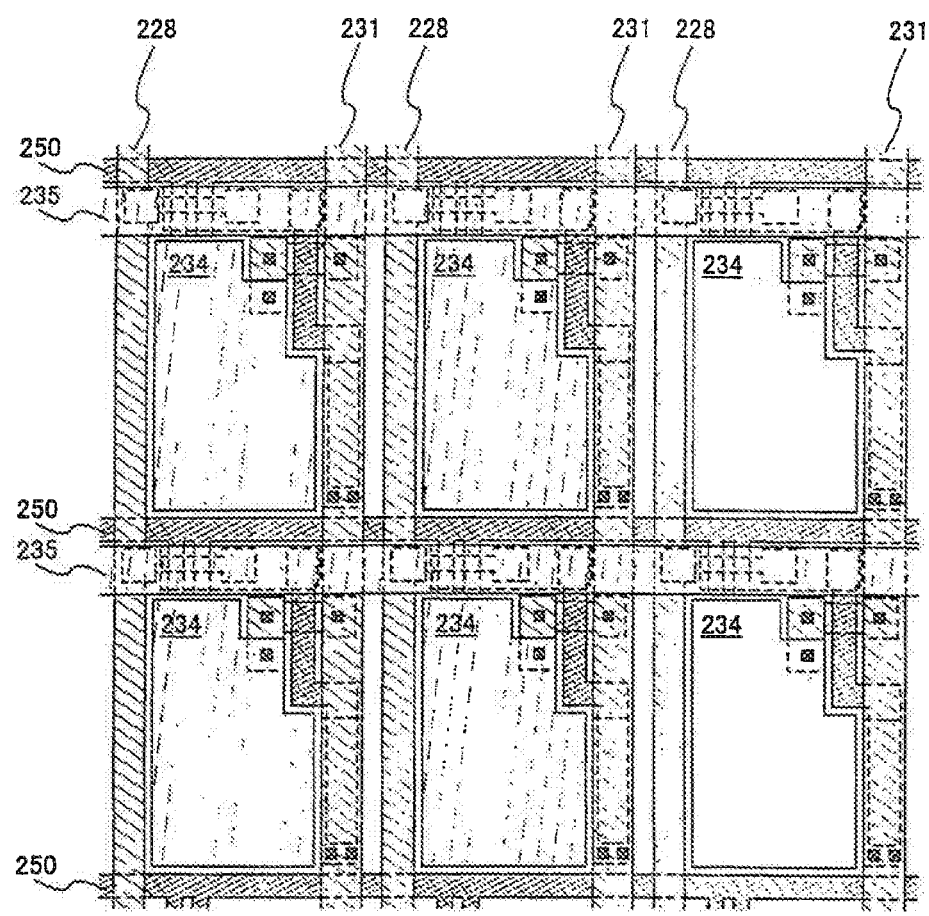
FIG. 9 is a top view of a light emitting device of the present invention.

Though not shown in FIG. 7A, the capacitance wiring line 235 that constitutes the capacitor storage 236 is connected to the capacitance wiring line 235 of the adjacent pixel. FIG. 9 shows how a plurality of pixels, each structured as illustrated in FIG. 8, are arranged.

The source line and the power supply line are denoted by 228 and 231, respectively. As shown in FIG. 9, the capacitance wiring line 235 in one pixel is connected to the capacitance wiring line 235 of its adjacent pixel. Alternatively, adjacent pixels share one capacitance wiring line 235. Every capacitance wiring line 235 receives a given electric potential. Denoted by 250 is the gate line that is connected to the gate electrode 211.

Figure 7B:
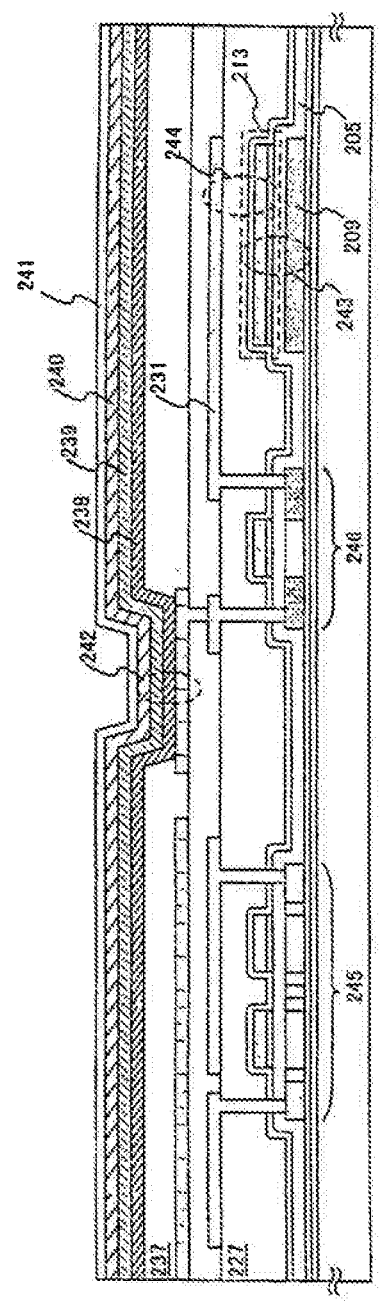

Next, a fourth interlayer insulating film 237 having an opening at the position that coincides with the pixel electrode 234 is formed as shown in FIG. 7B. The fourth interlayer insulating film 237 is capable of insulating, and functions as a bank to separate organic light emitting layers of adjacent pixels from one another. In this embodiment, a resist is used to form the fourth interlayer insulating film 237.

An organic light emitting layer 238 is then formed by evaporation. A cathode (MgAg electrode) 239 and a protective electrode 240 are also formed by evaporation. Desirably, heat treatment is conducted on the pixel electrode 234 prior to formation of the organic light emitting layer 238 and the cathode 239, so that moisture contained is removed completely. Although a MgAg electrode is used for the cathode of the OLED in this embodiment, other known materials may be used instead.

A known material can be used for the organic light emitting layer 238. The organic light emitting layer in this embodiment has a two-layer structure consisting of a hole transporting layer and a light emitting layer. The organic light emitting layer may additionally have one or some of a hole injection layer, an electron injection layer, and an electron transporting layer. Various combinations have been reported and the organic light emitting layer of this embodiment can take any of those.

The hole transporting layer of this embodiment is formed by evaporation from polyphenylene vinylene. The light emitting layer of this embodiment is formed by evaporation from polyvinyl carbazole with 30 to 40% of PBD, that is a 1, 3, 4-oxadiazole derivative, being molecule-dispersed. The light emitting layer is doped with about 1% of Coumarin 6 as green luminescent center.

The protective electrode 240 alone can protect the organic light emitting layer 238 from moisture and oxygen, but it is more desirable to use a protective film 241. This embodiment uses a silicon nitride film with a thickness of 300 nm as the protective film 241. The protective electrode 240 and the protective film may be formed in succession without exposing the device to the air.

The protective electrode 240 also prevents degradation of the cathode 239. A typical material of the protective electrode is a metal film mainly containing aluminum. Other materials may of course be used. Since the organic light emitting layer 238 and the cathode 239 are extremely weak against moisture, the organic light emitting layer, the cathode, and the protective electrode 240 are desirably formed in succession without exposing them to the air. The organic light emitting layer and the cathode are thus protected from the outside air.

The organic light emitting layer 238 is 10 to 400 nm in thickness (typically 60 to 150 nm), and the cathode 239 is 80 to 200 nm in thickness (typically 100 to 150 nm).

Thus completed is a light emitting device structured as shown in FIG. 7B. An area 242 where the pixel electrode 234, the organic light emitting layer 238, and the cathode 239 overlap corresponds to the OLED.

In this embodiment, a capacitor storage 243 is formed from the impurity region 209, the gate insulating film 205, and the capacitance electrode 213. A capacitor storage 244 is formed from the capacitance electrode 213, the second interlayer insulating film 227, and the power supply line 231. The impurity region 209 and the capacitance electrode 213 overlap the power supply line 231 and, therefore, the capacitor storages 243 and 244 can be formed without lowering the aperture ratio.

Denoted by 245 and 246 are a switching TFT and a driving TFT, respectively.

In practice, the device that has reached the stage of FIG. 7B is preferably packaged (sealed) to further avoid exposure to the outside air. For packaging, a protective film which is highly airtight and which allows little gas to leak (such as a laminate film or a UV-curable resin film) or a light-transmissive sealing member can be used. The reliability of the OLED is improved if the interior of the sealing member has an inert atmosphere or a hygroscopic material (barium oxide, for example) is placed inside.

The light emitting device of the present invention can be made by other methods than the manufacture method described in this embodiment. A known method can be used to manufacture the light emitting device of the present invention.

Embodiment 2

This embodiment describes a capacitor storage of the present invention which has a structure different from the one in FIG. 7A.

Figure 10:
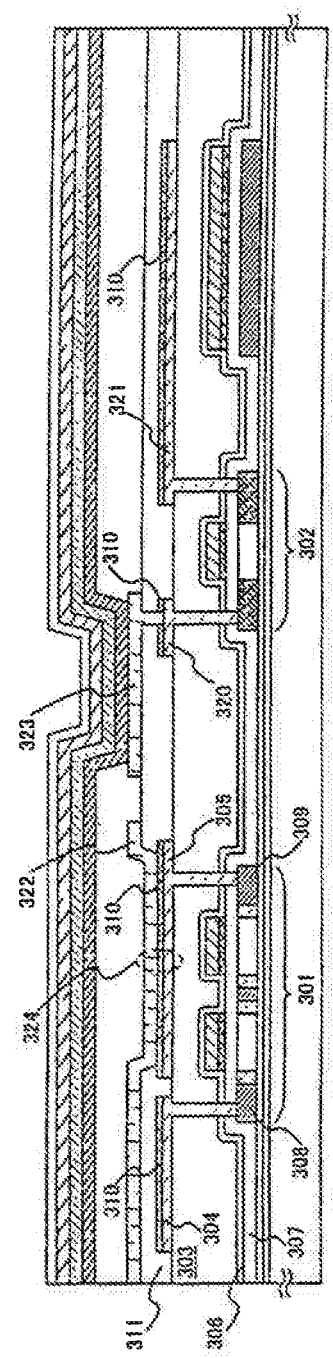
FIG. 10 is a sectional view of a pixel in a light emitting device of the present invention.

FIG. 10 is a sectional view of a pixel of this embodiment. Reference symbol 301 denotes a switching TFT, and 302, a driving TFT. The switching TFT and the driving TFT here are an n-channel TFT and a p-channel TFT, respectively, but this embodiment is not limited thereto. The switching TFT may be either a p-channel TFT or n-channel TFT, and the same applies to the driving TFT.

After a second interlayer insulating film 303 is formed, contact holes are formed in the second interlayer insulating film 303, a gate insulating film 307, and a first interlayer insulating film 306. Formed next is a conductive layer for forming connection wiring lines 305 and 320, a source line 304, and a power supply line 321. The conductive layer in this embodiment has a laminate structure in which a 300 to 500 nm thick conductive film mainly containing aluminum (Al) is laid on a 50 to 100 nm thick conductive film mainly containing titanium (Ti). A conductive film for forming connection wiring lines is a laminate of a combination of a film mainly containing tantalum (Ta), a conductive film mainly containing aluminum (Al), or a film mainly containing titanium (Ti).

On the surface of the conductive layer, an insulating film 310 is formed by anodization or plasma oxidization (anodization, in this embodiment) to have a thickness of 20 to 100 nm (preferably 30 to 50 nm). The insulating film serves as dielectric. In this embodiment, the connection wiring line 305 is a laminate of a film mainly containing aluminum and a film mainly containing titanium, and the film mainly containing aluminum is anodized to form an aluminum oxide film (alumina film) that is an anodized film. The anodized film in this embodiment corresponds to the insulating film 310, and is used as the dielectric of the capacitor storage. An insulating oxide film obtained by anodization of a tantalum (Ta) film or a titanium (Ti) film also has high dielectric constant and therefore is suitable as the dielectric of the capacitor storage.

For the anodization treatment, a tartaric acid ethylene glycol solution with a low enough alkaline ion concentration is prepared first. The solution is obtained by mixing a 15% tartaric acid ammonium aqueous solution and ethylene glycol at a ratio of 2:8. Ammonia water is added to the mixture to adjust pH thereof to 7±0.5. A platinum electrode that serves as a cathode is set in the thus prepared solution, and the substrate on which the conductive layer is formed is immersed in the solution. The conductive layer works as an anode and a direct current of a given amount (several mA to several tens mA) is caused to flow. In this embodiment, a 200 mA current flows in one substrate.

Though the voltage between the cathode and the anode in the solution changes with time as the anodized substance grows, the voltage is raised at a given rate until it reaches 45 V while keeping the current constant. Then, the anodization treatment is ended. In this way, the insulating film 310 with a thickness of about 50 nm is formed on the surface of the connection wiring line 305. The numeric values given here regarding the anodization are merely an example, and the optimal values naturally vary depending on the size of the element to be manufactured, and other factors.

When an anodized film is formed on an aluminum film under the anodization conditions of this embodiment, a $Al_xO_y$ film with a thickness of 51.4 nm is obtained. A 1 mmφ ITO film is formed on the $Al_xO_y$ film and a voltage of 5 V is applied between the Al film, the $Al_xO_y$ film, and the ITO film. As a result, a leakage current as minute as $1\times10^{-11}$ A is measured. This shows that the $Al_xO_y$ film can be used as dielectric of a capacitor storage of a light emitting device.

Although the insulating film 310 is formed by anodization here, the insulating film may be formed by a vapor phase method such as plasma CVD, thermal CVD, or sputtering. The insulating film may be a silicon oxide film, a silicon nitride film, a silicon nitride oxide film, a DLC (diamond like carbon) film, a tantalum oxide film, or an organic insulating film. A laminate having the above films in combination may be employed.

After the insulating film 310 is formed, the conductive film and the insulating film 310 are patterned into desired shapes to form the connection wiring line 305, the source line 304, the connection wiring line 320, and the power supply line 321. The source wiring line 304 is connected, through the contact hole formed in the second interlayer insulating film 303, the first interlayer insulating film 306, and the gate insulating film 307, to an impurity region 308 of the active layer of the switching TFT 301. Similarly, the connection wiring line 305 is connected, through the contact hole formed in the second interlayer insulating film 303, the first interlayer insulating film 306, and the gate insulating film 307, to an impurity region 309 of the active layer of the switching TFT 301.

A third interlayer insulating film 311 is then formed. A part of the third interlayer insulating film 311 is removed by etching to expose the insulating film 310 that is formed with being in contact with the connection wiring line 305. In a separate step, a contact hole reaching the connection wiring line 320 is formed. At this point, a part of the insulating film 310 that is in contact with the connection wiring line 320 is removed to expose the connection wiring line 320.

Thereafter, a transparent conductive film is formed and etched to form a capacitance wiring line 322 and a pixel electrode 323. The pixel electrode is connected to the connection wiring line 320 through the contact hole formed in the third interlayer insulating film 311.

In this embodiment, a capacitor storage 324 is formed from the connection wiring line 305, the insulating film 310 that is in contact with the connection wiring line 305, and the capacitance wiring line 322.

The capacitor storage structured in accordance with this embodiment has wider choices for the thickness of dielectric and for the dielectric constant than the one in Embodiment 1.

Embodiment 3

This embodiment describes a case of forming a gate line in the same layer as a connection wiring line.

Figure 11:
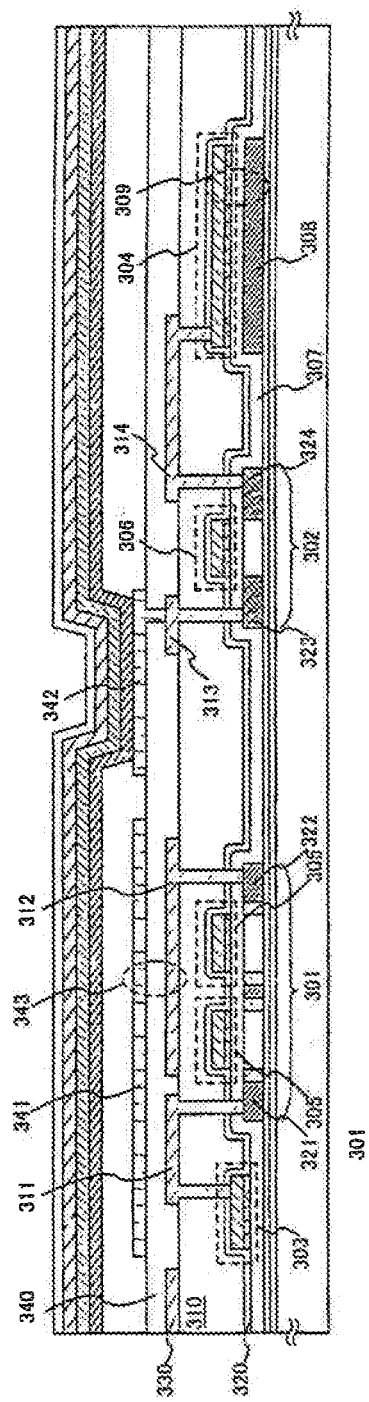
FIG. 11 is a sectional view of a pixel in a light emitting device of the present invention.

FIG. 11 is a sectional view of a pixel of this embodiment. Reference symbol 301 denotes a switching TFT, and 302, a driving TFT. Denoted by 303 and 304 are a source line and a power supply line, respectively.

The source line 303 and the power supply line 304 are formed on a gate insulating film 307 at the same time a gate electrode 305 of the switching TFT 301 and a gate electrode 306 of the driving TFT 302 are formed. A capacitance electrode 304 overlaps an impurity region 308 with the gate insulating film 307 interposed therebetween. The capacitance electrode 304, the gate insulating film 307, and the impurity region 308 constitute a capacitor storage 309.

Connection wiring lines 311 to 314 and a gate line 330 are formed on a second interlayer insulating film 310. The connection wiring line 311 is connected to the source line 303 through a contact hole formed in the second interlayer insulating film 310 and a first interlayer insulating film 320. The connection wiring line 314 is connected to the capacitance electrode 304 through another contact hole that is formed in the second interlayer insulating film 310 and the first interlayer insulating film 320.

The connection wiring line 311 is connected to an impurity region 321 of the switching TFT 301 through a contact hole formed in the second interlayer insulating film 310, the first interlayer insulating film 320, and the gate insulating film 307. The connection wiring line 312 is connected to an impurity region 322 of the switching TFT 301 through another contact hole formed in the second interlayer insulating film 310, the first interlayer insulating film 320, and the gate insulating film 307. Similarly, through contact holes formed in the second interlayer insulating film 310, the first interlayer insulating film 320, and the gate insulating film 307, the connection wiring line 313 is connected to an impurity region 323 of the driving TFT 302 and the connection wiring line 314 is connected to an impurity region 324 of the driving TFT 302.

The connection wiring line 312 overlaps the active layer of the switching TFT with the first and second interlayer insulating films 320 and 310 interposed therebetween. Though not shown, the gate line 330 is connected to the gate electrode 305 of the switching TFT through a contact hole formed in the second interlayer insulating film 310 and the first interlayer insulating film 320.

A third interlayer insulating film 340 is formed on the second interlayer insulating film 310 so as to cover the connection wiring lines 311 to 314 and the gate line 330. On the third interlayer insulating film 340, a capacitance wiring line 341 and a pixel electrode 342 are formed from the same conductive film. The pixel electrode 342 is connected to the connection wiring line 313 through a contact hole formed in the third interlayer insulating film 340.

A capacitor storage 343 that is the feature of the present invention is formed from the connection wiring line 312, the third interlayer insulating film 340, and the capacitance wiring line 341.

By forming the gate line on the same layer as the connection wiring line as in this embodiment, using different materials to form the gate electrode and the gate line does not lead to an increase in number of manufacture steps. Therefore, it is possible to form the gate electrode from a material suitable for fine processing whereas a low resistant material is used to form the gate line.

This embodiment may be combined freely with Embodiment 2.

Embodiment 4

This embodiment describes a pixel structure using a reverse stagger TFT.

Figure 12:
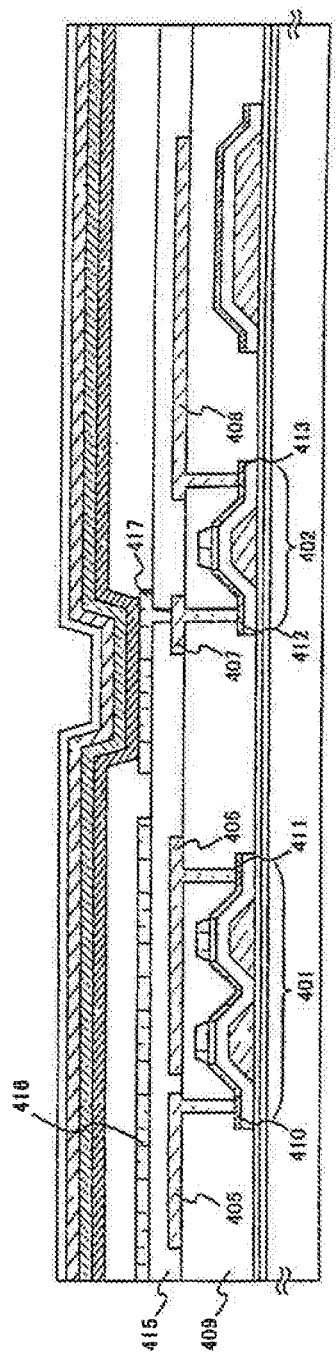
FIG. 12 is a sectional view of a pixel in a light emitting device of the present invention.

FIG. 12 is a sectional view of a pixel of this embodiment. Denoted by 401 and 402 are a switching TFT and a driving TFT, respectively.

A source line 405, connection wiring lines 406 and 407, and a power supply line 408 are formed on a first interlayer insulating film 409. The source line 405 is connected to an impurity region 410 of the switching TFT 401 through a contact hole formed in the first interlayer insulating film 409. The connection wiring line 406 is connected to an impurity region 411 of the switching TFT 401 through a contact hole formed in the first interlayer insulating film 409.

The connection wiring line 407 is connected to an impurity region 412 of the driving TFT 402 through a contact hole formed in the first interlayer insulating film 409. The power supply line 408 is connected to an impurity region 413 of the driving TFT 402 through a contact hole formed in the first interlayer insulating film 409.

A second interlayer insulating film 415 is formed on the first interlayer insulating film 409 so as to cover the source line 405, the connection wiring lines 406 and 407, and the power supply line 408. On the second interlayer insulating film 415, a capacitance wiring line 416 and a pixel electrode 417 are formed from the same conductive film. The pixel electrode 417 is connected to the connection wiring line 407 through a contact hole formed in the second interlayer insulating film 415.

This embodiment may be combined freely with the structure of Embodiment 2.

Embodiment 5

This embodiment describes a case of forming a gate line between an active layer of a switching TFT and a substrate.

Figure 13:
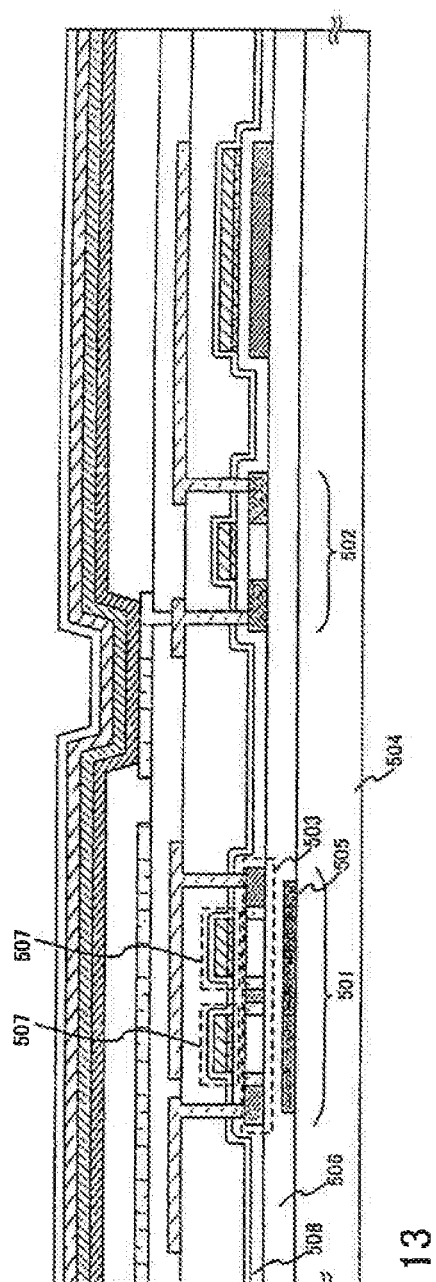
FIG. 13 is a sectional view of a pixel in a light emitting device of the present invention.

FIG. 13 is a sectional view of a pixel of this embodiment. Denoted by 501 and 502 are a switching TFT and a driving TFT, respectively. A light-shielding film 505 functioning as a gate line is formed between an active layer 503 of the switching TFT 501 and a substrate 504.

The light-shielding film 505 may be a polysilicon film, a $WSi_x$ (x=2.0 to 2.8) film, or a film formed of a conductive material such as Al, Ta, W, Cr, and Mo. Alternatively, the light-shielding film may be a combination of these films. In this embodiment, a polysilicon film with a thickness of 50 nm and a $WSi_x$ film with a thickness of 100 nm are layered to form the light-shielding film 505.

A base insulating film 506 is formed between the light-shielding film 505 and the active layer 503. The base insulating film 506 is an insulating film containing silicon (for example, a silicon oxide film, a silicon oxynitride film, and a silicon nitride film) and formed by plasma CVD or sputtering.

In a later step, before forming a gate electrode 507 of the switching TFT 501, a contact hole reaching the light-shielding film 505 is formed in the base insulating film 506. Then a conductive film for forming the gate electrode 507 is formed. The conductive film is patterned to form the gate electrode 507, which is connected to the light-shielding film 505.

In the above structure, the gate line overlaps the switching TFT 501 and therefore the aperture ratio is raised.

This embodiment may be combined freely with Embodiment 2.

Embodiment 6

This embodiment describes a method of driving a light emitting device of the present invention.

Figure 14:
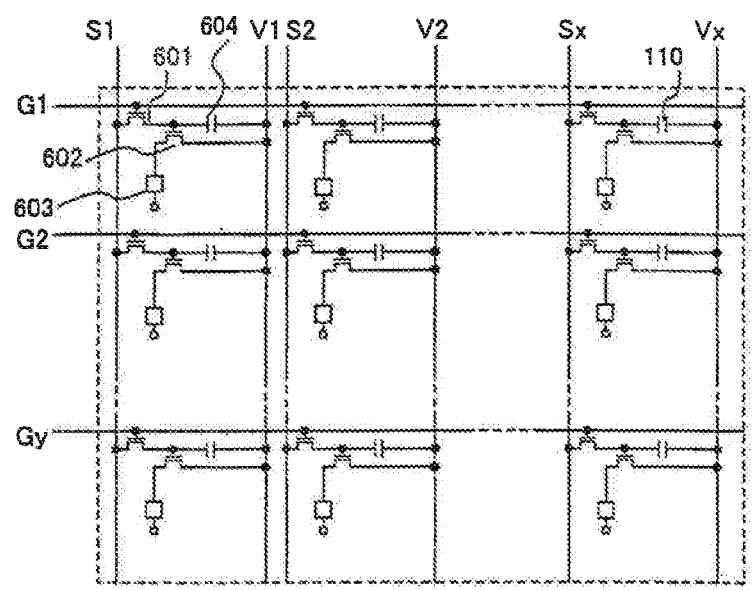
FIG. 14 is a circuit diagram of a pixel portion in a light emitting device of the present invention.

FIG. 14 is a circuit diagram of a pixel portion in a light emitting device of the present invention. Reference symbol 601 denotes a switching TFT, 602, a driving TFT, 603, an OLED, and 604, a capacitor storage. Details about connection structure in the pixel are the same as those in the pixel shown in FIG. 1.

The pixel portion has source lines S1 to Sx, power supply lines V1 to Vx, and gate lines G1 to Gy. Each pixel has one of the source lines S1 to Sx, one of the power supply lines Vi to Vx, and one of the gate lines G1 to Gy.

Figure 15:
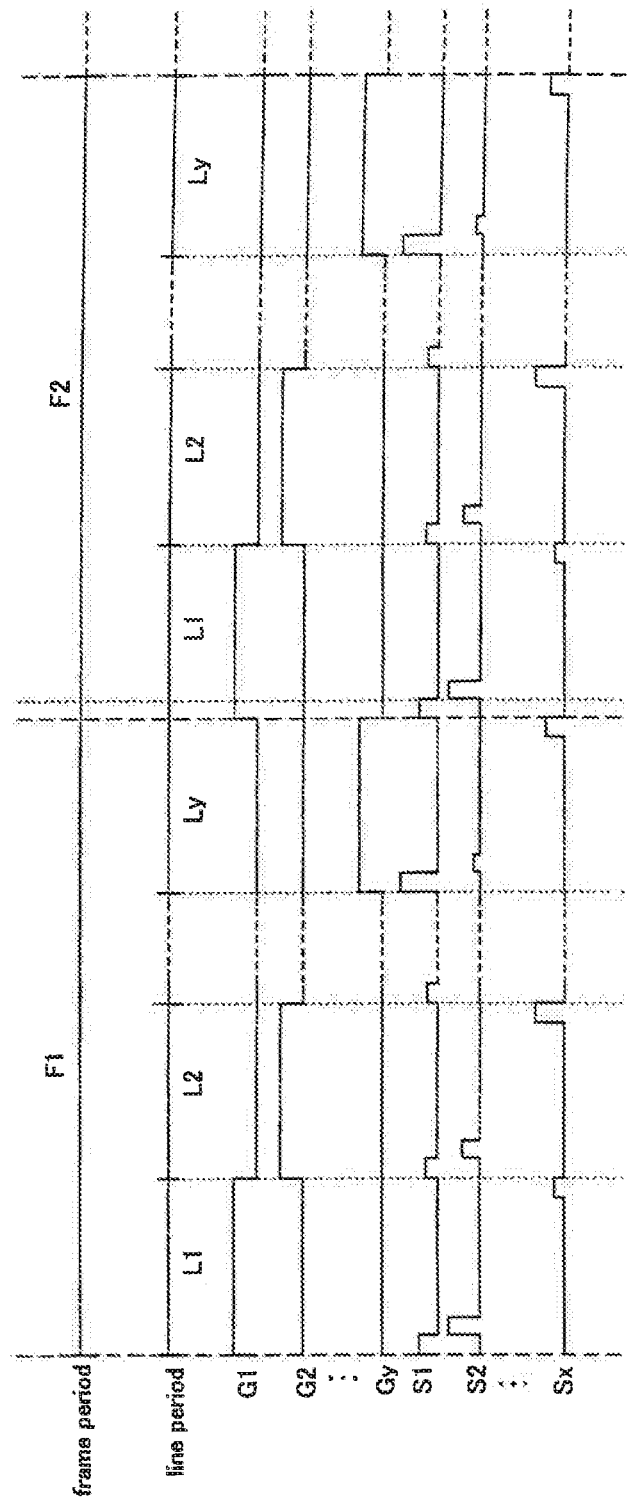
FIG. 15 is a timing chart in analog driving.

FIG. 15 is a timing chart of the light emitting device shown in FIG. 14 when analog driving is used. A period starting as one gate line is selected and ending as a different gate line is selected next is called one line period (L). In this specification, selecting a gate line means that every TFT whose gate electrode is connected to the selected gate line is turned ON.

A period starting as one image is displayed and ending as the next image is displayed corresponds to one frame period (F). The light emitting device shown in FIG. 14 has y gate lines. Therefore one frame period has y line periods (L1 to Ly).

The electric potential of the power supply lines (V1 to Vx) (power supply electric potential) is kept constant. The electric potential of an opposite electrode is also kept constant. The electric potential difference between the opposite electrode and the power supply lines is large enough to cause an OLED to emit light when the power supply electric potential is given to a pixel electrode of the OLED.

In the first line period (L1), the gate line G1 is selected in response to a selection signal to turn every switching TFT 601 that is connected to the gate line G1 ON. Then analog video signals are inputted to the source lines (S1 to Sx) in order. The analog video signals inputted to the source lines (S1 to Sx) are then inputted to a gate electrode of the driving TFT 602 through the switching TFT 601.

The amount of current flowing in a channel forming region of the driving TFT 602 is controlled by a gate voltage $V_{GS}$, which represents the electric potential difference between the gate electrode of the driving TFT 602 and a source region thereof. Therefore the electric potential given to the pixel electrode of the OLED 603 is determined by the level of electric potential of an analog video signal inputted to the gate electrode of the driving TFT 602. The OLED 603 thus emits light at a luminance controlled by the electric potential of the analog video signal.

The operation described above is repeated until inputting analog video signals to all of the source lines (S1 to Sx) is finished. Then, the first line period (L1) is completed. One line period may alternatively be defined as a period required to finish inputting analog video signals to the source lines (S1 to Sx) plus a horizontal retrace period. Next, the second line period (L2) is started and the gate line G2 is selected in response to a selection signal. Then, similar to the first line period (L1), analog video signals are inputted to the source lines (S1 to Sx) in order.

After every gate line (every one of G1 to Gy) is selected once, all of the line periods (L1 to Ly) are completed. Completion of all the line periods (L1 to Ly) brings completion of one frame period. In one frame period, all pixels are used to display and one image is formed. One frame period may alternatively be defined as all line periods (L1 to Ly) plus vertical retrace periods.

As described above, the luminance of an OLED is controlled by the electric potential of an analog video signal in analog driving, and gray scale display is obtained through the control of the luminance.

In analog driving, the capacity of a capacitor storage is desirably larger than in digital driving. Therefore, the structure of the light emitting device of the present invention, in which the capacitor storage can have a large capacity while avoiding lowering of the aperture ratio, is suitable for analog driving. However, the present invention is not limited to this driving method and the present invention can fully be applied to a digitally-driven light emitting device.

This embodiment may be combined freely with Embodiments 1 through 5.

Embodiment 7

This embodiment describes a method of driving a light emitting device structured as shown in FIG. 14 which is different from the driving method of Embodiment 6.

Figure 16:
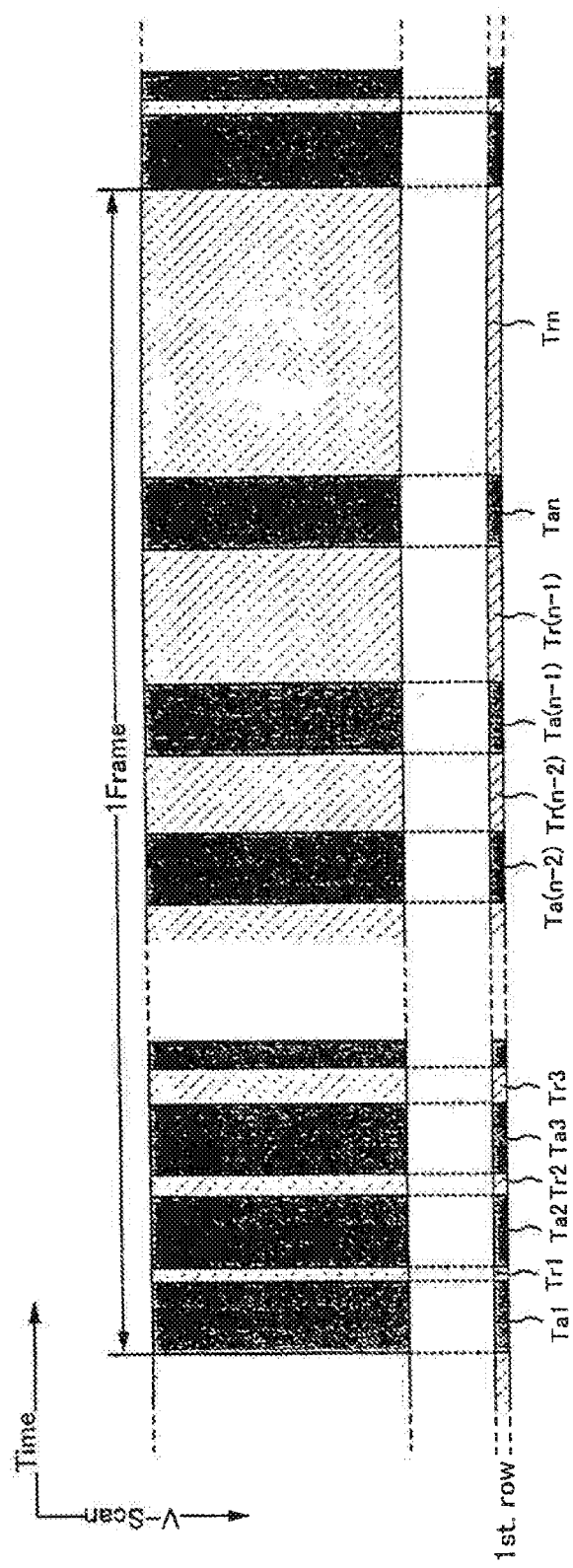
FIG. 16 is a timing chart in digital driving.

A light emitting device of this embodiment displays an image using a digital video signal that carries image information. FIG. 16 is a timing chart showing points at which writing periods and light emission periods are started in digital driving. In FIG. 16, the axis of abscissa indicates time whereas the axis of ordinate indicates positions of pixels of the respective lines.

First, the power supply electric potential of the power supply lines (V1 to Vx) is kept at the same level as the electric potential of the opposite electrode of the OLED 603. The gate line G1 is selected in response to a selection signal to turn the switching TFT 601 of every pixel that is connected to the gate line G1 (every pixel on Line One) ON.

A first set of one bit digital video signals are inputted to the source lines (S1 to Sx). The digital video signals are then inputted to the gate electrode of the driving TFT 602 through the switching TFT 601.

When the gate line G1 is no longer selected, the gate line G2 is selected to turn the switching TFT 601 in every pixel that is connected to the gate line G2 ON. Then, the first set of one bit digital video signals are inputted from the source lines (S1 to Sx) to the pixels on Line Two.

In this way, all the gate lines (G1 to Gy) are selected one by one. A period it takes for the first set of one bit digital video signals to be inputted to the pixels of all the lines after all the gate lines (G1 to Gy) are selected is a writing period Ta1.

As the writing period Ta1 is ended, a display period Tr1 is started. In the display period Tr1, the power supply electric potential of the power supply lines is set to a level that produces an electric potential difference with the electric potential of the opposite electrode large enough to cause the OLED to emit light when the power supply electric potential is given to the pixel electrode of the OLED.

In the display period Tr1, whether the OLED 603 emits light or not is determined by the digital video signals that have been written in the pixels in the writing period Ta1. The driving TFT 602 is turned OFF when a digital video signal contains information of '0'. Accordingly, the power supply electric potential is not given to the pixel electrode of the OLED 603. Therefore no light is emitted from the OLED 603 of a pixel to which a digital video signal having information of '0' is inputted. When a digital video signal has information of '1', on the other hand, the driving TFT 602 is turned ON. Then, the power supply electric potential is given to the pixel electrode of the OLED 603. Therefore, light is emitted from the OLED 603 of a pixel to which a digital video signal having information of '1' is inputted.

Thus, the OLED 603 emits or does not emit light in the display period Tr1 and all the pixels are used to display.

As the display period Tr1 is ended, a writing period Ta2 is started and the power supply electric potential of the power supply lines is set to the same level as the electric potential of the opposite electrode of the OLED. Similar to the writing period Ta1, all the gate lines are selected one by one and a second set of one bit digital video signals are inputted to all of the pixels in order. The writing period Ta2 is a period it takes for the second set of one bit digital video signals to be inputted to pixels of all the lines.

As the writing period Ta2 is ended, a display period Tr2 is started. In this period, the power supply electric potential of the power supply lines is set to a level that produces an electric potential difference with the electric potential of the opposite electrode large enough to cause the OLED 603 to emit light when the power supply electric potential is given to the pixel electrode of the OLED 603. Then, all of the pixels are used to display.

The above operation is repeated until inputting an n-th set of one bit digital video signals to the pixels is finished, alternating one writing period Ta with one display period Tr. When all display periods (Tr1 to Trn) are completed, one image is displayed. In the driving method of this embodiment, a period required to display one image is called one frame period (F). When one frame period is ended, the next frame period is started. Then, the writing period Ta1 is started again to repeat the operation described above.

In a usual light emitting device, preferably sixty or more frame periods are provided in one second. If the number of images displayed in one second is less than sixty, flickering of image may become noticeable to the eye.

In this embodiment, the lengths of all writing periods in total have to be shorter than the length of one frame period and it is necessary to set the ratio of lengths of display periods to satisfy Tr1: Tr2: Tr3: . . . : Tr(n-1): Trn=$2^0$: $2^1$: $2^2$: . . . $2^{(n-2)}$: $2^{(n-1)}$. A desired gray scale out of $2^n$ gray scales can be displayed by combining the display periods.

The gray scale of a pixel in one frame period is determined by the sum of lengths of display periods in the one frame period in which the OLED of that pixel emits light. For example, if n=8, a pixel obtains 100% of luminance when the pixel emits light in all display periods. When the pixel emits light in Tr1 and Tr2, the luminance thereof is 1%. When the pixel emits light in Tr3, Tr5, and Tr8, the luminance thereof is 60%.

The display periods Tr1 to Trn may be run in any order. For instance, in one frame period started by Tr1, Tr3, Tr5, Tr2, . . . may follow Tr1 in this order.

In this embodiment, the power supply electric potential of the power supply lines is set to different levels in a writing period and in a display period. However, the present invention is not limited thereto. The power supply electric potential and the electric potential of the opposite electrode may always keep an electric potential difference large enough to cause the OLED to emit light when the power supply electric potential is given to the pixel electrode of the OLED. In this case, the OLED can emit light also in a writing period. Then, the gray scale of a pixel in one frame period is determined by the sum of lengths of writing periods and display periods in the one frame period in which the OLED of that pixel emits light. Here, lengths of writing periods and display periods for digital video signals of the respective bits have to be set to satisfy the following ratio. (Ta1+Tr1): (Ta2+Tr2): (Ta3+Tr3): . . . : (Ta(n-1)+Tr(n-1)): (Tan+Trn)=$2^0$: $2^1$: $2^2$: . . . $2^{(n-2)}$: $2^{(n-1)}$.

This embodiment may be combined freely with Embodiments 1 through 5.

Embodiment 8

Figure 17A:
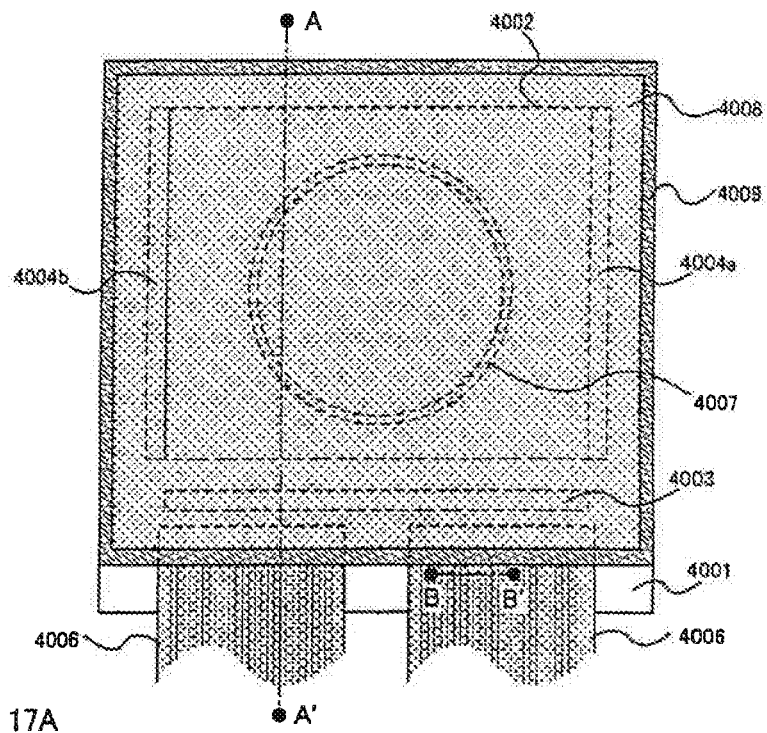
FIGS. 17A to 17C are diagrams of a light emitting device of the present invention, with FIG. 17A showing a top view thereof and FIGS. 17B and 17C showing sectional views thereof.
Figure 17B:
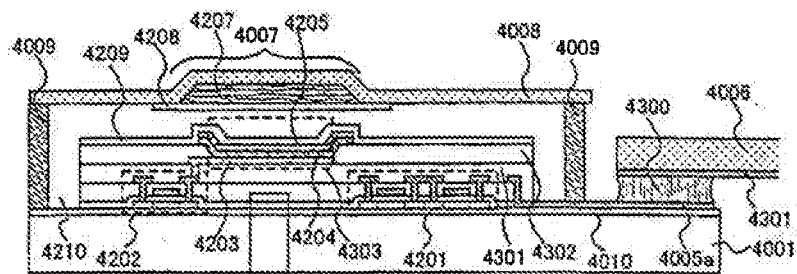
Figure 17C:
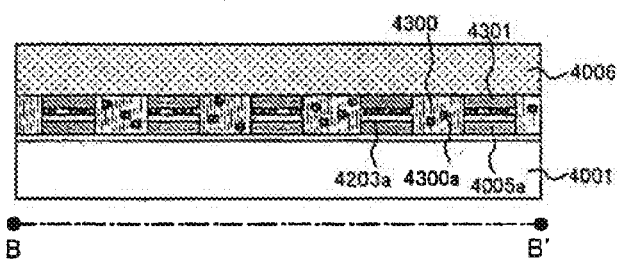

This embodiment describes with reference to FIGS. 17A to 17C a case of manufacturing a light emitting device using the present invention.

FIG. 17A is a top view of a light emitting device in which a substrate with an OLED formed thereon is sealed by a sealing member. FIG. 17B is a sectional view taken along the line A-A' in FIG. 17A. FIG. 17C is a sectional view taken along the line B-B' in FIG. 17A.

A pixel portion 4002, a source line driving circuit 4003, and first and second gate line driving circuits 4004a and 4004b are formed on a substrate 4001. A seal member 4009 is placed so as to surround them all on the substrate. A sealing member 4008 is provided on the pixel portion 4002, the source line driving circuit 4003, and the first and second gate line driving circuits 4004a and 4004b. Accordingly, the pixel portion 4002, the source line driving circuit 4003, and the first and second gate line driving circuits 4004a and 4004b are sealed in the space defined by the substrate 4001, the seal member 4009, and the sealing member 4008, with a filler 4210 filling the space.

The pixel portion 4002, the source line driving circuit 4003, and the first and second gate line driving circuits 4004a and 4004b on the substrate 4001 each have a plurality of TFTs. The source line driving circuit 4003 is a circuit for inputting video signals to source lines. The first and second gate line driving circuits 4004a and 4004b are circuits for selecting a gate line in response to a selection signal.

FIG. 17B shows, as representatives of those TFTs, a driving circuit TFT (composed of an n-channel TFT and a p-channel TFT in FIG. 17B) 4201 included in the source line driving circuit 4003 and a driving TFT (a TFT for controlling a current flowing into the OLED) 4202 included in the pixel portion 4002. The TFTs 4201 and 4202 are formed on a base film 4010. In this embodiment, the n-channel TFT or the p-channel TFT that constitutes the driving circuit TFT 4201 is manufactured by a known method, and a p-channel TFT manufactured by a known method is used for the driving TFT 4202. The pixel portion 4002 is provided with a capacitor storage (not shown) connected to a gate of the driving TFT 4202.

Formed on the driving circuit TFT 4201 and the driving TFT 4202 is an interlayer insulating film (planarization film) 4301, on which a pixel electrode (anode) 4203 is formed to be electrically connected to a drain of the driving TFT 4202. The pixel electrode 4203 is formed of a transparent conductive film having a large work function. Examples of the usable transparent conductive film material include a compound of indium oxide and tin oxide, a compound of indium oxide and zinc oxide, zinc oxide alone, tin oxide alone, and indium oxide alone. A transparent conductive film formed of one of these materials and doped with gallium may also be used for the pixel electrode.

An insulating film 4302 is formed on the pixel electrode 4203. An opening is formed in the insulating film 4302 above the pixel electrode 4203. At the opening above the pixel electrode 4203, an organic light emitting layer 4204 is formed. The organic light emitting layer 4204 is formed of a known organic luminous material or inorganic luminous material. Either low molecular weight (monomer) organic luminous materials or high molecular weight (polymer) organic luminous materials can be used for the organic light emitting layer.

The organic light emitting layer 4204 is formed by a known evaporation technique or application technique. The organic light emitting layer may consist solely of a light emitting layer. Alternatively, the organic light emitting layer may be a laminate having, in addition to a light emitting layer, a hole injection layer, a hole transporting layer, an electron transporting layer, and an electron injection layer in any combination.

A cathode 4205 is formed on the organic light emitting layer 4204 from a light-shielding conductive film (typically, a conductive film mainly containing aluminum, copper, or silver, or a laminate consisting of the above conductive film and other conductive films). Desirably, moisture and oxygen are removed as much as possible from the interface between the cathode 4205 and the organic light emitting layer 4204. Some contrivance is needed for the removal. For example, the organic light emitting layer 4204 is formed in a nitrogen or rare gas atmosphere and then the cathode 4205 is successively formed without exposing the substrate to moisture and oxygen. This embodiment uses a multi-chamber system (cluster tool system) film formation apparatus to achieve the film formation described above. The cathode 4205 receives a given voltage.

An OLED 4303 composed of the pixel electrode (anode) 4203, the organic light emitting layer 4204, and the cathode 4205 is thus formed. A protective film 4209 is formed on the insulating film 4302 so as to cover the OLED 4303. The protective film 4209 is effective in preventing oxygen and moisture from entering the OLED 4303.

Denoted by 4005a is a lead-out wiring line connected to a power supply line, and is electrically connected to a source region of the driving TFT 4202. The lead-out wiring line 4005a runs between the seal member 4009 and the substrate 4001 and is electrically connected to an FPC wiring line 4301 of an FPC 4006 through an anisotropic conductive film 4300.

The sealing member 4008 is formed of a glass material, a metal material (typically a stainless steel material), a ceramic material, or a plastic material (including a plastic film). Examples of the usable plastic material include an FRP (fiberglass-reinforced plastic) plate, a PVF (polyvinyl fluoride) film, a Mylar film, a polyester film, and an acrylic resin film. A sheet obtained by sandwiching an aluminum foil between PVF films or Mylar films may also be used.

However, if light emitted from the OLED travels toward the sealing member, the sealing member has to be transparent. In this case, a transparent material such as a glass plate, a plastic plate, a polyester film, or an acrylic film is used.

The filler 4210 may be inert gas such as nitrogen and argon, or a UV-curable resin or a thermally curable resin. Examples thereof include PVC (polyvinyl chloride), acrylic, polyimide, an epoxy resin, a silicone resin, PVB (polyvinyl butylal), and EVA (ethylene vinyl acetate). In this embodiment, nitrogen is used as the filler.

In order to expose the filler 4210 to a hygroscopic substance (preferably barium oxide) or a substance capable of adsorbing oxygen, a hygroscopic substance 4207, or a substance 4207 capable of adsorbing oxygen, is placed in a convex portion 4007 formed on a surface of the sealing member 4008 on the substrate 4001 side. The hygroscopic substance 4207, or a substance 4207 capable of adsorbing oxygen, is held down to the convex portion 4007 by a concave portion covering member 4208 to prevent hygroscopic substance 4207, or a substance 4207 capable of adsorbing oxygen, from scattering. The convex portion covering member 4208 is a dense mesh and allows air and moisture to pass but not the hygroscopic substance 4207, or a substance 4207 capable of adsorbing oxygen. The hygroscopic substance 4207, or a substance 4207 capable of adsorbing oxygen, can prevent degradation of the OLED 4303.

As shown in FIG. 17C, a conductive film 4203a is formed to be brought into contact with the top face of the lead-out wiring line 4005a at the same time the pixel electrode 4203 is formed.

The anisotropic conductive film 4300 has a conductive filler 4300a. The conductive filler 4300a electrically connects the conductive film 4203a on the substrate 4001 to the FPC wiring line 4301 on the FPC 4006 upon thermal press fitting of the substrate 4001 and the FPC 4006.

This embodiment may be combined freely with Embodiments 1 through 7.

Embodiment 9

In this embodiment, an external light emitting quantum efficiency can be remarkably improved by using an organic light emitting material by which phosphorescence from a triplet exciton can be employed for emitting a light. As a result, the power consumption of the OLED can be reduced, the lifetime of the OLED can be elongated and the weight of the OLED can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an organic light emitting material (coumarin pigment) reported by the above article is represented as follows.

Chemical formula 1

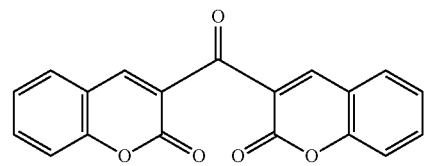

(M. A. Baldo, D. F. O'Brien, Y. You, A. Shoustikov, S. Sibley, M. E. Thompson, S. R. Forrest, Nature 395 (1998) p. 151).

The molecular formula of an organic light emitting material (Pt complex) reported by the above article is represented as follows.

Chemical formula 2

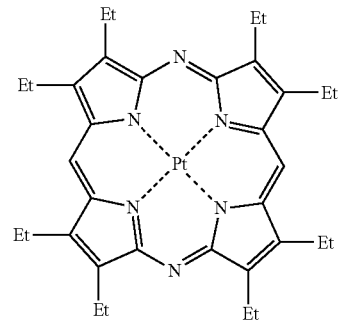

(M. A. Baldo, S. Lamansky, P. E. Burrows, M. E. Thompson, S. R. Forrest, Appl. Phys. Lett., 75 (1999) p. 4.)

(T. Tsutsui, M.-J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an organic light emitting material (Ir complex) reported by the above article is represented as follows.

Chemical formula 3

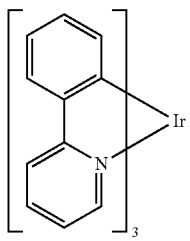

As described above, if phosphorescence from a triplet exciton can be put to practical use, it can realize the external light emitting quantum efficiency three to four times as high as that in the case of using fluorescence from a singlet exciton in principle.

The structure according to this embodiment can be freely implemented in combination of any structures of Embodiments 1 to 8.

Embodiment 10

This embodiment describes a capacitor storage of the present invention which has a structure different from the one shown in FIG. 2.

Figure 21:
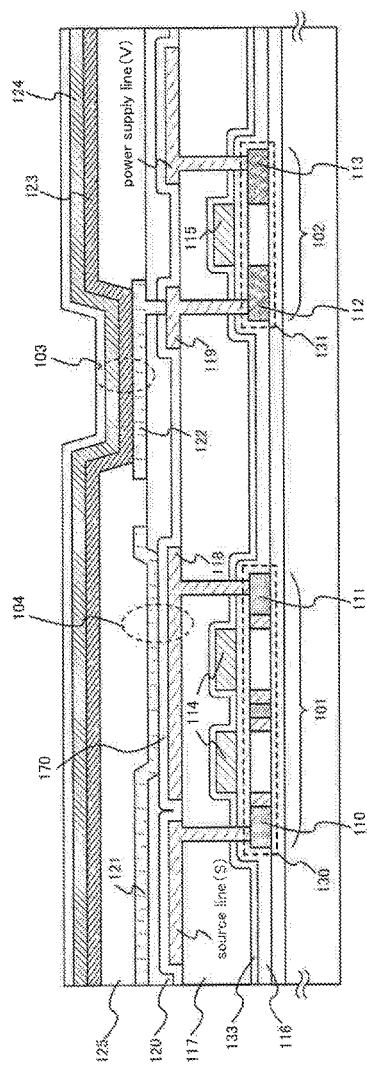
FIG. 21 is a sectional view of a pixel in a light emitting device of the present invention.

FIG. 21 is a sectional view of a pixel of this embodiment. Components common to those in FIG. 2 are denoted by the same symbols.

On the second interlayer insulating film 117, the source line (S), the connection wiring lines 118 and 119, and the power supply line (V) are formed. The source line (S) is connected to the impurity region 110 through a contact hole that is formed in the second interlayer insulating film 117. The connection wiring line 118 is connected to the impurity region 111 through a contact hole that is formed in the second interlayer insulating film 117. The connection wiring line 119 is connected to the impurity region 112 through a contact hole that is formed in the second interlayer insulating film 117. The power supply line (V) is connected to the impurity region 113 through a contact hole that is formed in the second interlayer insulating film 117. The connection wiring line 118 overlaps the active layer 130 with the second interlayer insulating film 117 interposed therebetween.

A capacitance insulating film 170 is formed on the second interlayer insulating film 117 so as to cover the source line (S), the connection wiring lines 118 and 119, and the power supply line (V). The material of the capacitance insulating film 170 may be either inorganic or organic as long as the material is capable of insulating. However, the material has to have a different selective ratio in etching from the selective ratio of the subsequently formed third interlayer insulating film 120.

The third interlayer insulating film 120 is formed on the capacitance insulating film 170. A part of the third interlayer insulating film where it overlaps the connection wiring line 118 is removed through etching to expose the capacitance insulating film 170. When a capacitance wiring line 121 is formed later, this structure brings the connection wiring line 118, the capacitance insulating film 170, and the capacitance wiring line 121, which are formed in this order, into contact with one another.

On the third interlayer insulating film 120, the capacitance wiring line 121 and a pixel electrode 122 are formed.

The pixel electrode 122 is connected to the connection wiring line 119 through a contact hole that is formed in the third interlayer insulating film 120.

In this embodiment, the capacitor storage 104 is formed in an area where the capacitance insulating film 170 is sandwiched between the connection wiring line 118 and the capacitance wiring line 121. The capacitance insulating film 170 is described in this embodiment as a layer separate from the third interlayer insulating film 120. However, the capacitance insulating film 170 may be regarded as a part of the third interlayer insulating film 120 that is comprised of layers of insulating films.

The structure of this embodiment may be combined with any of the structures of Embodiment 1 and Embodiments 3 through 9.

Embodiment 11

Being self-luminous, a light emitting device has better visibility in bright places and wider viewing angle than liquid crystal display devices. Therefore the light emitting device can be used for display units of various electric appliances.

Given as examples of an electric appliance that employs a light emitting device manufactured in accordance with the present invention are video cameras, digital cameras, goggle type displays (head mounted displays), navigation systems, audio reproducing devices (such as car audio and audio components), notebook computers, game machines, portable information terminals (such as mobile computers, cellular phones, portable game machines, and electronic books), and image reproducing devices equipped with recording media (specifically, devices with a display device that can reproduce data in a recording medium such as a digital versatile disk (DVD) to display an image of the data). Wide viewing angle is important particularly for portable information terminals because their screens are often slanted when they are looked at. Therefore it is preferable for portable information terminals to employ the light emitting device using the organic light emitting element. Specific examples of these electric appliance are shown in FIGS. 18A to 18H.

Figure 18A:
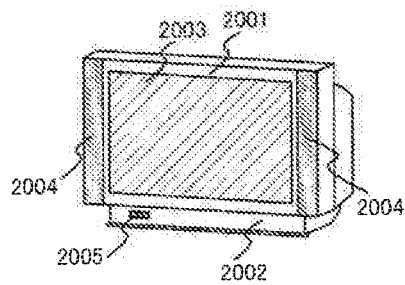
FIGS. 18A to 18H are diagrams showing electronic appliance using a light emitting device of the present invention.

FIG. 18A shows an OLED display device, which is composed of a case 2001, a support base 2002, a display unit 2003, speaker units 2004, a video input terminal 2005, etc. The light emitting device manufactured in accordance with the present invention can be applied to the display unit 2003. Since the light emitting device is self-luminous, the device does not need back light and can make a thinner display unit than liquid crystal display devices. The OLED display device refers to all display devices for displaying information, including ones for personal computers, for TV broadcasting reception, and for advertisement.

Figure 18B:
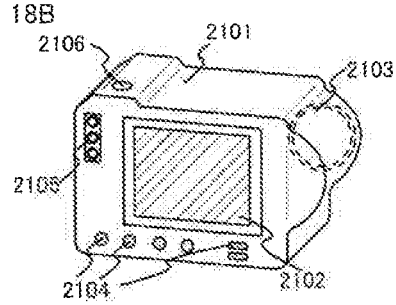

FIG. 18B shows a digital still camera, which is composed of a main body 2101, a display unit 2102, an image receiving unit 2103, operation keys 2104, an external connection port 2105, a shutter 2106, etc. The light emitting device manufactured in accordance with the present invention can be applied to the display unit 2102.

Figure 18C:
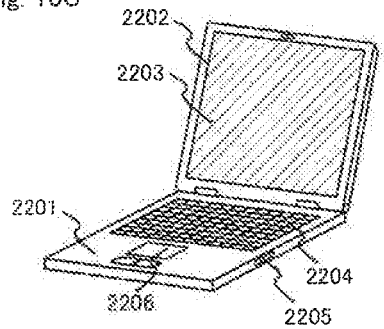

FIG. 18C shows a notebook personal computer, which is composed of a main body 2201, a case 2202, a display unit 2203, a keyboard 2204, an external connection port 2205, a pointing mouse 2206, etc. The light emitting device manufactured in accordance with the present invention can be applied to the display unit 2203.

Figure 18D:
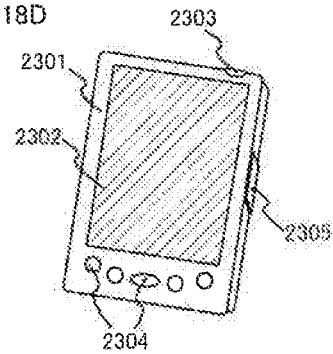

FIG. 18D shows a mobile computer, which is composed of a main body 2301, a display unit 2302, a switch 2303, operation keys 2304, an infrared port 2305, etc. The light emitting device manufactured in accordance with the present invention can be applied to the display unit 2302.

Figure 18E:
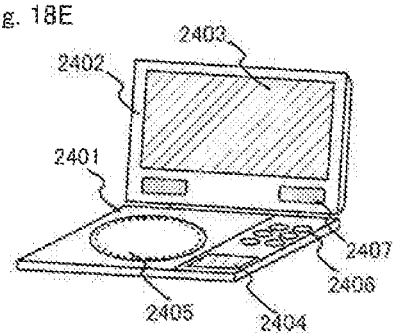

FIG. 18E shows a portable image reproducing device equipped with a recording medium (a DVD player, to be specific). The device is composed of a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. The light emitting device manufactured in accordance with the present invention can be applied to the display units A 2403 and B 2404. The image reproducing device equipped with a recording medium also includes home-video game machines.

Figure 18F:
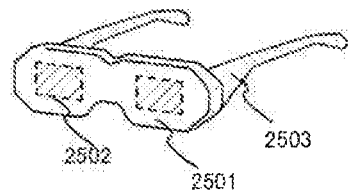

FIG. 18F shows a goggle type display (head mounted display), which is composed of a main body 2501, display units 2502, and arm units 2503. The light emitting device manufactured in accordance with the present invention can be applied to the display units 2502.

Figure 18G:
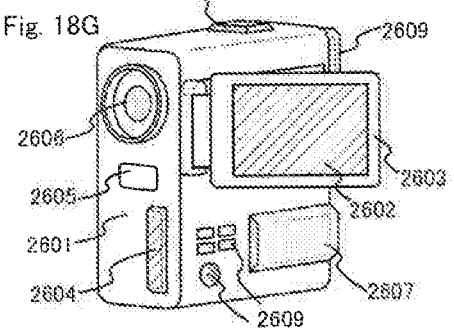

FIG. 18G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609, etc. The light emitting device manufactured in accordance with the present invention can be applied to the display unit 2602.

Figure 18H:
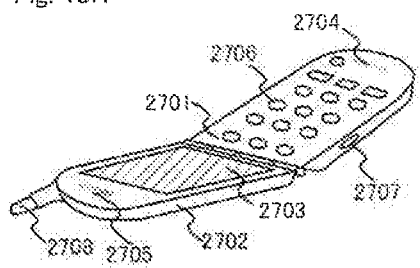
Figure 19:
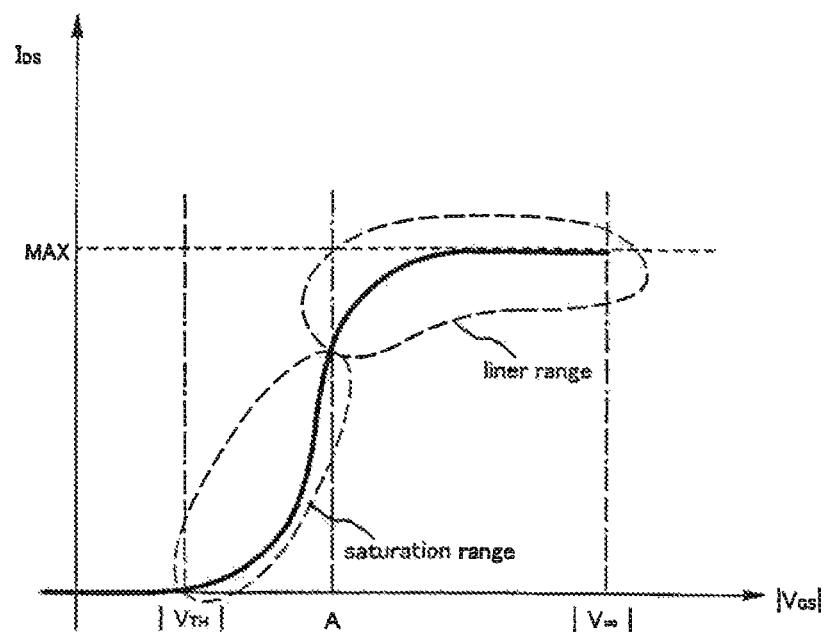
FIG. 19 is a graph showing a transistor characteristic of a driving TFT.

FIG. 18H shows a cellular phone, which is composed of a main body 2701, a case 2702, a display unit 2703, an audio input unit 2704, an audio output unit 2705, operation keys 2706, an external connection port 2707, an antenna 2708, etc. The light emitting device manufactured in accordance with the present invention can be applied to the display unit 2703. If the display unit 2703 displays white letters on black background, the cellular phone consumes less power.

If the luminance of light emitted from organic materials is raised in future, the light emitting device can be used in front or rear projectors by enlarging outputted light that contains image information through a lens or the like and projecting the light.

These electric appliances now display with increasing frequency information sent through electronic communication lines such as the Internet and CATV (cable television), especially, animation information. Since organic light emitting materials have very fast response speed, the light emitting device is suitable for animation display.

In the light emitting device, light emitting portions consume power and therefore it is preferable to display information in a manner that requires less light emitting portions. When using the light emitting device in display units of portable information terminals, particularly cellular phones and audio reproducing devices that mainly display text information, it is preferable to drive the device such that non-light emitting portions form a background and light emitting portions form text information.

As described above, the application range of the light emitting device manufactured in accordance with the present invention is so wide that it is applicable to electric appliances of any field. The electric appliances of this embodiment can employ any light emitting device disclosed in Embodiments 1 through 9.

With the above structure, the present invention allows the capacitor storage to overlap the TFT, thereby increasing the capacity of the capacitor storage while keeping the aperture ratio from lowering. Accordingly, a change in gate voltage due to leakage or other causes can be avoided to prevent a change in luminance of an OLED and flickering of screen in analog driving.

Keeping the aperture ratio from lowering also leads to preventing the area of effective light emission of a pixel from being reduced. As the area of effective light emission is larger, the luminance of the screen is higher. Therefore, the structure of the present invention is effective in reducing power consumption.

What is claimed is:

1. A light-emitting device including a pixel portion, the pixel portion comprising:
    a first transistor and a second transistor over a substrate, each including a semiconductor region, a gate insulating film over the semiconductor region, and a gate electrode over the gate insulating film;
    an organic insulating film over the first transistor and the second transistor;
    a pixel electrode containing indium tin oxide over and in contact with the organic insulating film; and
    a wiring containing indium tin oxide over and in contact with the organic insulating film,
    wherein the pixel electrode is electrically connected to the semiconductor region of the second transistor, and
    wherein the wiring overlaps the semiconductor region of the first transistor.

2. The light-emitting device according to claim 1, wherein the gate electrode of the second transistor is electrically connected to the semiconductor region of the first transistor.

3. The light-emitting device according to claim 1, wherein the wiring is a capacitance wiring.

4. A display module comprising a flexible printed circuit connected to the light-emitting device and the light-emitting device according to claim 1.

5. The display module according to claim 4, wherein the display module is incorporated in one selected from the group consisting of a digital still camera, a personal computer, a mobile computer, a portable image reproducing device, a goggle type display, a video camera and a cellular phone.

6. A light-emitting device including a pixel portion, the pixel portion comprising:
    a first transistor and a second transistor over a plastic substrate, each including a semiconductor region, a gate insulating film over the semiconductor region, and a gate electrode over the gate insulating film;
    an organic insulating film over the first transistor and the second transistor;
    a pixel electrode containing indium tin oxide over and in contact with the organic insulating film; and
    a wiring containing indium tin oxide over and in contact with the organic insulating film,
    wherein the pixel electrode is electrically connected to the semiconductor region of the second transistor, and
    wherein the wiring overlaps the semiconductor region of the first transistor.

7. The light-emitting device according to claim 6, wherein the gate electrode of the second transistor is electrically connected to the semiconductor region of the first transistor.

8. The light-emitting device according to claim 6, wherein the wiring is a capacitance wiring.

9. A display module comprising a flexible printed circuit connected to the light-emitting device and the light-emitting device according to claim 6.

10. The display module according to claim 9, wherein the display module is incorporated in one selected from the group consisting of a digital still camera, a personal computer, a mobile computer, a portable image reproducing device, a goggle type display, a video camera and a cellular phone.

11. A light-emitting device including a pixel portion, the pixel portion comprising:

a first transistor, a second transistor, and a source wiring, wherein the source wiring is electrically connected to a gate of the second transistor through a source and a drain of the first transistor;

a first organic insulating film over the first transistor, the second transistor, and the source wiring;

a wiring over the first organic insulating film;

a light-emitting element over the first organic insulating film and electrically connected to a source or a drain of the second transistor, wherein the light-emitting element comprises:
  a pixel electrode;
  an organic light-emitting layer over the pixel electrode; and
  an opposite electrode over the organic light-emitting layer; and a second organic insulating film over the wiring and comprising an opening overlapping with the pixel electrode, wherein the organic light-emitting layer is provided in the opening, wherein:
  the wiring and the pixel electrode are each provided over and in contact with the first organic insulating film and do not overlap with each other; and
  the wiring is overlapped with the first transistor and crossed with the source wiring with the first organic insulating film interposed between the wiring and the source wiring.

12. The light-emitting device according to claim 11, wherein the organic light-emitting layer overlaps with the wiring with the second organic insulating film interposed therebetween.

13. The light-emitting device according to claim 11, wherein the wiring and the pixel electrode each comprise indium and tin.

14. The light-emitting device according to claim 11, further comprising a protective electrode over and in contact with the opposite electrode.

15. The light-emitting device according to claim 11, wherein the wiring is a capacitance wiring.

* * * * *